(12) United States Patent
Awad et al.

(10) Patent No.: US 6,970,896 B2
(45) Date of Patent: Nov. 29, 2005

(54) METHOD AND APPARATUS FOR GENERATING A SET OF FILTER COEFFICIENTS

(75) Inventors: Thomas Jefferson Awad, Kirkland (CA); Pascal Marcel Gervais, Montreal (CA); Martin Laurence, Montreal (CA)

(73) Assignee: Octasic Inc., Montreal (CA)

( * ) Notice: Subject to any disclaimer, the term of this patent is extended or adjusted under 35 U.S.C. 154(b) by 608 days.

(21) Appl. No.: 09/925,545

(22) Filed: Aug. 8, 2001

(65) Prior Publication Data

US 2003/0074381 A1 Apr. 17, 2003

(51) Int. Cl.$^7$ ............................................. G06F 17/10
(52) U.S. Cl. .................................................... 708/322
(58) Field of Search ............................... 708/322–323; 375/223–236

(56) References Cited

U.S. PATENT DOCUMENTS

| | | | |
|---|---|---|---|
| 5,062,102 A | | 10/1991 | Taguchi |
| 5,117,418 A | | 5/1992 | Chaffee et al. |
| 5,200,915 A | | 4/1993 | Hayami et al. |
| 5,329,587 A | | 7/1994 | Morgan et al. |
| 5,375,147 A | * | 12/1994 | Awata et al. ............... 375/232 |
| 5,442,569 A | | 8/1995 | Osano |

(Continued)

FOREIGN PATENT DOCUMENTS

| | | |
|---|---|---|
| EP | 0709958 A1 | 1/1996 |
| EP | 0 872 962 A2 | 10/1998 |
| EP | 0 982 861 A2 | 3/2000 |
| GB | 2164828 A | 3/1986 |

OTHER PUBLICATIONS

Deisher, M.E. et al., "Practical Considerations in the Implementation of a Frequency–Domain Adaptive Noise Canceller", IEEE Transactions on Circuits and Systems, II; Analog and Digital Signal Processing, IEEE Inc. New York, US, vol. 41, No. 2, Feb. 1, 1994, pp. 164–168, XP000443037.

Adaptive filters; Theory and Applications/B. Farhang–Boroujeny. John Wiley & Sons Ltd. (chapter 12, pp. 413–437).

Numerical recipes in C: the art of scientific computing/ William H. Press Cambridge University Press (chapters 1–2, pp. 1–99).

Linear Predictive Spectral Shaping for Acoustical Echo Cancellation. Sanro Zlobec. Department of Electrical Engineering, McGill University, Montreal, Nov. 1995.

*Primary Examiner*—Tan V. Mai
(74) *Attorney, Agent, or Firm*—Wolf, Greenfield & Sacks, P.C.

(57) ABSTRACT

A filter adaptation unit for producing a set of filter coefficients indicative of a transfer function of a system in a given state is provided including a coefficient set selection unit for selecting between two or more sets of filter coefficients. For each set of filter coefficients a respective set of error characterization data elements is generated characterizing the error in a filter's impulse response when using the corresponding set of filter coefficients. The selection unit provides functionality for processing the first and second sets of filter coefficients and the second set of error characterization data elements in order to detect whether a change in the state of the system has occurred and to select a preferred set of filter coefficients. The selected set of filter coefficients is released in a format suitable for use by an adaptive filter. A method and apparatus selecting a set of filter coefficients from a plurality of sets of filter coefficients is also provided, where each set of filter coefficient is associated to a segment of a first signal. The sets of filter coefficients are compared to one another to select at least one set of filter coefficients from the plurality of sets of filter coefficients at least in part on the basis of energy values associated to impulse response of the plurality of sets of filter coefficients.

38 Claims, 9 Drawing Sheets

U.S. PATENT DOCUMENTS

| | | |
|---|---|---|
| 5,526,426 A | 6/1996 | McLaughlin |
| 5,630,154 A | 5/1997 | Bolstad et al. |
| 5,790,598 A | 8/1998 | Moreland et al. |
| 5,889,857 A | 3/1999 | Boudy et al. |
| 5,912,966 A | 6/1999 | Ho |
| 5,974,377 A | 10/1999 | Navarro et al. |
| 6,035,312 A | 3/2000 | Hasegawa |
| 6,151,358 A | 11/2000 | Lee et al. |
| 6,246,773 B1 | 6/2001 | Eastty |
| 6,396,872 B1 | 5/2002 | Sugiyama |
| 6,437,932 B1 * | 8/2002 | Prater et al. ............ 708/323 |
| 6,483,872 B2 * | 11/2002 | Nguyen ............ 708/323 |
| 6,622,118 B1 | 9/2003 | Crooks et al. |
| 6,735,304 B2 | 5/2004 | Hasegawa |
| 6,744,886 B1 | 6/2004 | Benesty et al. |
| 6,757,384 B1 | 6/2004 | Ketchum et al. |
| 6,768,796 B2 | 7/2004 | Lu |
| 2002/0114445 A1 | 8/2002 | Benesty et al. |
| 2003/0031242 A1 | 2/2003 | Awad et al. |
| 2003/0072362 A1 | 4/2003 | Awad et al. |
| 2003/0084079 A1 | 5/2003 | Awad et al. |

* cited by examiner

US 6,970,896 B2

METHOD AND APPARATUS FOR GENERATING A SET OF FILTER COEFFICIENTS

CROSS-REFERENCES TO RELATED APPLICATION

This application is related to the following applications:
1. U.S. patent application Ser. No. 09/925,231 entitled, "Method and Apparatus for Generating a Set of Filter Coefficients for a Time Updated Adaptive Filter", filed Aug. 8, 2001 by Awad T. et al. and currently pending.
2. U.S. patent application Ser. No. 09/925,194 entitled, "Method and Apparatus for Providing an Error Characterization Estimate of an Impulse Response Derived using Least Squares", filed Aug. 8, 2001 by Awad T. et al. and currently pending.
3. U.S. patent application Ser. No. 09/925,247 entitled, "Method and Apparatus for Generating a Set of Filter Coefficients Providing Adaptive Noise Reduction", filed Aug. 8, 2001 by Awad T. et al. and currently pending.

The contents of the above noted documents are hereby incorporated by reference.

FIELD OF THE INVENTION

The present invention relates generally to adaptive systems and, more particularly, to a method and apparatus for generating a set of filter coefficients. The method and apparatus are suitable for use in echo cancellation devices, equalizers, and in general, systems requiring time updated adaptive filtering.

BACKGROUND

Various adaptive filter structures have been developed for use in time updated adaptive systems to solve acoustical echo cancellation, channel equalization and other problems; examples of such structures include for example, transversal, multistage lattice, systolic array, and recursive implementations. Among these, transversal finite-impulse-response (FIR) filters are often used, due to stability considerations, and to their versatility and ease of implementation. Many algorithms have also been developed to adapt these filters, including the least-mean-squares (LMS), recursive least-squares, sequential regression, and least-squares lattice algorithms.

A deficiency of many existing methods is that they generate new sets of filter coefficients iteratively, where the next set of filter coefficients depends on the previous set of filter coefficients. This is the case for the commonly used least-mean-square (LMS) algorithm. Occasionally, a newly generated set of filter coefficients is a worse representation of the impulse response to be approximated than the previously generated set of filter coefficients. However, existing methods generally select the new set of filter coefficients and provide no suitable method for addressing this deficiency.

Consequently, there is a need in the industry for providing filter adaptation unit suitable for producing a set of filter coefficients that alleviates, at least in part, the deficiencies of the prior art.

SUMMARY OF THE INVENTION

In accordance with a broad aspect, the invention provides a method suitable for producing a set of filter coefficients indicative of an impulse response of a system in a given state. A sequence of samples of a first signal and a sequence of samples of a second signal are received. A first set of filter coefficients is generated on the basis of a first subset of the sequence of samples of the first signal and a first subset of the sequence of samples of the second signal. The first set of filter coefficients is such that when an adaptive filter applies the first set of filter coefficients on the first signal, a first estimate of the certain component in the second signal is generated, the certain component being correlated to the first signal. A second set of filter coefficients is also generated on the basis of a second subset of the sequence of samples of the first signal and a second subset of the sequence of samples of the second signal. At least some samples in the second subsets are subsequent to the samples in corresponding first subsets. The second set of filter coefficients is such that when an adaptive filter applies the second set of filter coefficients on the first signal, a second estimate of the certain component in the second signal is generated, the certain component being correlated to the first signal. The first signal and the second signal are processed on the basis of the first set of filter coefficients to generate a first set of error characterization data elements and on the basis of the second set of filter coefficients to generate a second set of error characterization data elements. The first and second sets of filter coefficients and the second set of error characterization data elements are then processed to detect a change of state in the system. If a change of state is detected, the second set of filter coefficients is selected. If no change of state is detected, either one of the first set of filter coefficients and the second set of filter coefficients is selected, at least in part, on the basis of the first and second sets of error characterization data elements. A signal indicative of the selected set of filter coefficients is then released.

Advantageously, the invention allows detecting changes in the state of a system since the previously generating set of filter coefficients. In the non-limiting specific example of implementation of an echo canceller, this method allows the detection of echo point changes.

In a non-limiting example of implementation, the first subset of the sequence of samples of the first signal includes a plurality of successive samples, where the plurality of successive samples includes a beginning sample. Similarly, the second subset of the sequence of samples of the first signal includes a plurality of successive samples, where the plurality of successive samples includes a beginning sample. The detection of a change of state is prevented when the beginning sample of the first subset of the sequence of samples of the first signal is received subsequently to the beginning sample of the second subset of the sequence of samples of the first signal.

In other words, when the second subset of the sequence of samples of the first signal includes samples preceding the samples in the first subset of the sequence of samples of the first signal, then no change of state is detected. An advantage of this aspect is that it allows the newer samples to have a greater influence on the selection of the set of filter coefficients than the older samples. For example, consider the case where the first set of filter coefficients is computed on the basis of samples of the first signal from time X to time Y and the second set of filter coefficients is computed on the basis of samples of the first signal from time A to time B. Since at least some samples in the second subset are subsequent to the samples in corresponding first subset, time B occurs later than time Y, or B>Y. In the case where A precedes X, or A<X, no change in the state of the system can be detected since any change of state should have already been taken into account by the first set of filter coefficients computed on the basis of the samples from time X to time Y. When A occurs subsequently to X, or A>X, a change in the state of the system may be detected.

In a non-limiting implementation, the first set of filter coefficients and the second set of filter coefficients are compared to derive a first distance measure data element. The first set of error characterization data elements is also compared to the second set of error characterization data elements to derive a second distance measure data element. A change of state is detected at least in part on the basis of the first distance measure data element and the second distance measure data element.

Continuing the non-limiting example of implementation, each error characterization data element in the first and second sets of error characterization data elements is associated to a respective frequency band selected from a set of frequency bands. The first set of filter coefficients is processed to derive a first set of spectral values, each spectral value corresponding to a respective frequency band selected from the set of frequency bands. The second set of filter coefficients is also processed to derive a second set of spectral values, each spectral value corresponding to a respective frequency band selected from the set of frequency bands. The first set of spectral values is compared to the second set of spectral values to derive a set of first distance measure data elements, where each of the first distance measure data elements is associated to a respective frequency band from the set of frequency bands. The first set of error characterization data elements and the second set of error characterization data elements are also compared to derive a set of second distance measure data element, each of second distance measure data elements being associated to a respective frequency band from the set of frequency bands. A change of state is detected, at least in part, on the basis of the set of first distance measure data elements and the set of second distance measure data elements.

In a specific implementation, the set of frequency bands comprises one or more frequency bands.

In a specific example of implementation, when no change of state is detected, a first energy data element is computed at least in part on the basis of the first set of error characterization data elements. The first energy data element is indicative of an error size associated to the first set of filter coefficients. A second energy data element is also computed at least in part on the basis of the second set of error characterization data elements. The second energy data element is indicative of an error size associated to the second set of filter coefficients. Either one of the first set and the second set of filter coefficients is selected on the basis of the first energy data element and the second energy data element.

Advantageously, the invention allows selecting between sets of filter coefficients on the basis of characteristics of the error function.

In a non-limiting example, the set of filter coefficients associated to the lowest error size is selected.

In a specific example of implementation, the second set of filter coefficients is processed at least in part on the basis of a reference set of data elements to determine whether the second set of filter coefficients is indicative of a substantially null transfer function.

In accordance with another broad aspect, the invention provides an apparatus for implementing the above-described method.

In accordance with yet another broad aspect, the invention provides a computer readable medium including a program element suitable for execution by a computing apparatus for generating a set of filter coefficients in accordance with the above described method.

In accordance with another aspect, the invention provides an adaptive system. The adaptive system includes first and second input for receiving a sequence of samples from a first signal and a sequence of samples of a second signal respectively. The second signal includes a certain component that is correlated to the first signal. The adaptive system also includes a filter adaptation unit and an adaptive filter. The filter adaptation unit has a coefficient generation unit for generating a first set of filter coefficients on the basis of first subsets of the sequences of samples of the first signal and the second signal. The coefficient generation unit is also for generating a second set of filter coefficients on the basis of second subsets of the sequences of samples of the first signal and the second signal. At least some samples in the second subsets are subsequent to the samples in corresponding first subsets. An error characterization unit processes the first signal and the second signal on the basis of the first set of filter coefficients to generate a first set of error characterization data elements associated to the first set of filter coefficients. The error characterization unit processes the first signal and the second signal on the basis of the second set of filter coefficients to generate a second set of error characterization data elements associated to the second set of filter coefficients. A selection unit processes the first and second sets of filter coefficients and the second set of error characterization data elements to detect whether a change of state has occurred. When a change of state is detected, the second set of filter coefficients is selected. When no change of state is detected, either one of the first set of filter coefficients and the second set of filter coefficients is selected, at least in part, on the basis of the first and second sets of error characterization data elements. An output releases a signal indicative of the set of filter coefficients selected by the selection unit. The adaptive filter applies a filtering operation to the first signal on the basis of the set of filter coefficients received from the filter adaptation unit and generates an estimate of the component in the second signal, the component being correlated to the first signal.

In accordance with another aspect, the invention provides an echo cancellor comprising the above-described adaptive system.

In accordance with another aspect, the invention provides a method and filter adaptation unit suitable for producing a set of filter coefficients. The filter adaptation unit has a first input for receiving a sequence of samples of a first signal and a second input for receiving a sequence of samples of a second signal. The second signal includes a certain component that is correlated to the first signal. A processing unit generates a plurality of sets of filter coefficients on the basis of the sequences of samples of the first signal and the second signal, each set of filter coefficients in the plurality of sets of filter coefficients being associated to a respective segment of the second signal. A selection unit selects at least one set of filter coefficients from the plurality of sets of filter coefficients at least in part on the basis of the plurality of sets of filter coefficients and the first signal. An output releases a signal indicative of the set of filter coefficients selected by the selection unit.

Other aspects and features of the present invention will become apparent to those ordinarily skilled in the art upon review of the following description of specific embodiments of the invention in conjunction with the accompanying figures.

DETAILED DESCRIPTION

Figure 1:
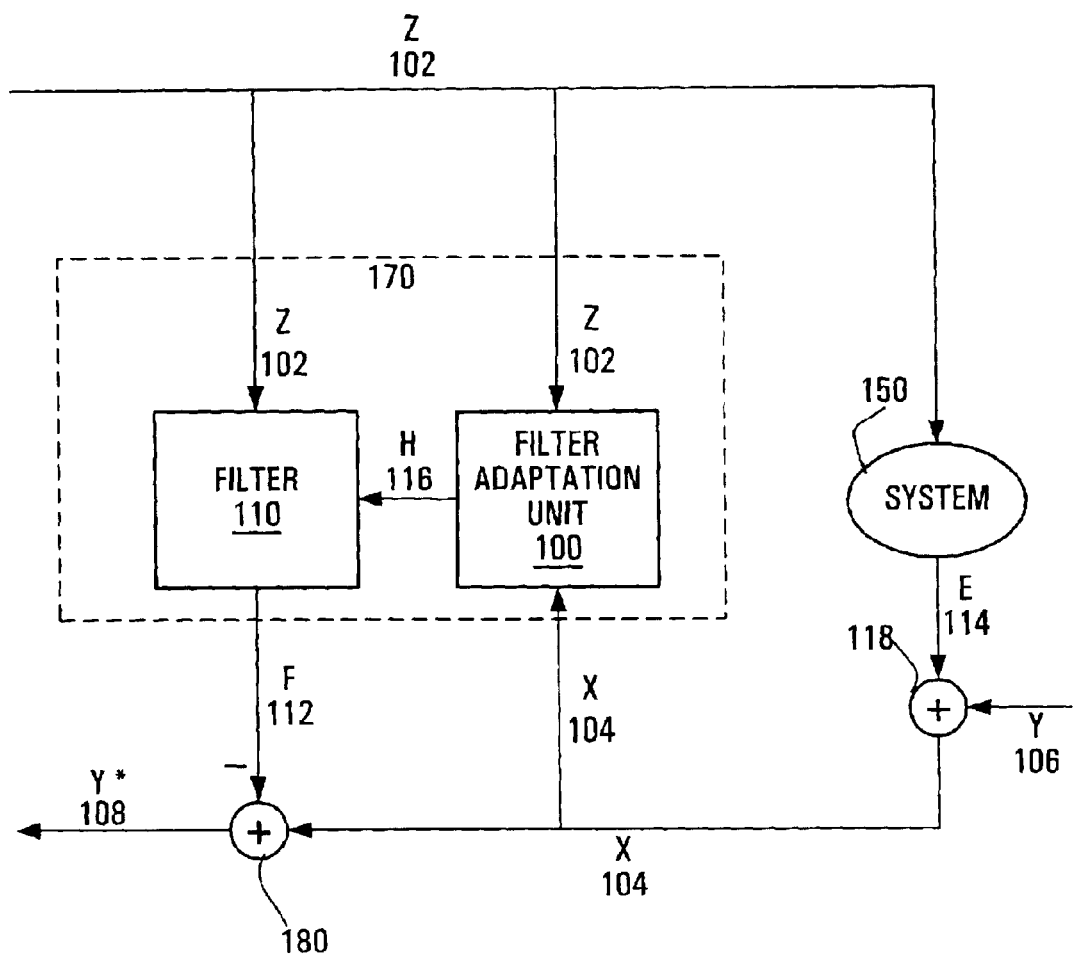
FIG. 1 is a block diagram of a time adaptive system including a filter adaptation unit 100 in accordance with an embodiment of the present invention.

FIG. 1 shows a time adaptive system 170 in accordance with an embodiment of the present invention. In one example of non-limiting implementation, the time adaptive system 170 is used to remove unwanted components of a return signal Z 102 from a forward signal Y 106. Typically, the return signal Z 102 passes through a system 150 and emerges in the form of a noise signal E 114 which corrupts the forward signal Y 106, resulting in a corrupted forward signal X 104. In a digital system, this corruption process may be modelled as a sample-by-sample addition performed by a conceptual adder 118. Thus, each sample of the corrupted forward signal X 104 is the sum of a component due to the (clean) forward signal Y 106 and another component due to the noise signal E 114 where the noise signal E 114 is correlated to the return signal Z 102.

A non-limiting use of the time adaptive system 170 is in the context of acoustical echo cancellation, for example, in a hands-free telephony system that includes a loudspeaker and a microphone. In this case, the forward signal Y 106 is a locally produced speech signal which is injected into the microphone (represented by conceptual adder 118), the return signal Z 102 is a remotely produced speech signal which is output by the loudspeaker, the system 150 is a room or car interior and the noise signal E 114 is a reverberated version of the return signal Z 102 which enters the same microphone used to pick up the forward signal Y 106. The corrupted forward signal X 104 is the sum of the signals input to the microphone, including the clean forward signal Y 106 as well as the reverberation represented by the noise signal E 114.

Another non-limiting use of the time adaptive system 170 is in the context of electric echo cancellation, for example, where the echo is caused by an analog/digital conversion on the transmission channel rather than by a signal reverberation in a closed space. In this case, the forward signal Y 106 is a locally produced speech signal which travels on the forward path of the communication channel, the return signal Z 102 is a remotely produced speech signal which travels on the return path of the communication channel, the system 150 is an analog/digital conversion unit and the noise signal E 114 is a reflected version of the return signal Z 102 which travels on the same forward path of the communication channel as the forward signal Y 106. The corrupted forward signal X 104 is the sum of the clean forward signal Y 106 as well as the noise signal E 114.

To cancel the corruptive effect of the noise signal E 114 on the forward signal Y 106, there is provided a filter 110, suitably embodied as an adaptive digital filter. The filter 110 taps the return signal Z 102 (which feeds the system 150) and applies a filtering operation thereto. In one embodiment of the present invention, such a filtering operation can be performed by a finite impulse response (FIR) filter that produces a filtered signal F 112.

The filter 110 includes a plurality N of taps at which delayed versions of the return signal Z 102 are multiplied by respective filter coefficients, whose values are denoted $h_j$, $0 \leq j \leq N-1$. The N products are added together to produce the filter output at time T. Simply stated, therefore, the filtered signal F 112 at a given instant in time is a weighted sum of the samples of the return signal Z 102 at various past instances.

The filter coefficients $h_j$ are computed by a filter adaptation unit 100 configured to receive the return signal Z 102 and the corrupted forward signal X 104. The manner in which the filter adaptation unit 100 processes these signals to compute the filter coefficients $h_j$ is described in greater detail herein below.

Mathematically, the filtered signal F 112 at the output of the filter 110 can be described by the following relationship:

$$f_t = \sum_{i=0}^{N-1} h_i z_{t-i} \quad \text{Equation 1}$$

where
  t is the current sample time;
  $f_t$ is the value of the filtered signal F 112 at time t;
  $h_j$ is the value of the $j^{th}$ filter coefficient;
  $z_k$ is a sample of the return signal Z 102 at time k; and
  N is the length (i.e., the number of taps) of the filter 110.
For convenience, equation 1 may be represented in matrix form as follows:

$$f_t = \underline{h}^T \underline{z}_t \quad \text{Equation 2}$$

where the underscore indicates a vector or matrix, where the superscript "$T$" denotes the transpose (not to be confused with the sample time "t" used as a subscript) and where:

$$\underline{h} = \begin{bmatrix} h_0 \\ h_1 \\ \ldots \\ h_{N-1} \end{bmatrix} \text{ and } \underline{z}_t = \begin{bmatrix} z_t \\ z_{t-1} \\ \ldots \\ z_{t-(N-1)} \end{bmatrix} \quad \text{Equation 3}$$

The output of the filter 110, namely the filtered signal F 112, is subtracted on a sample-by-sample basis from the corrupted forward signal X 104 to yield an estimate, denoted Y* 108, of the clean forward signal Y 106. In a desirable situation, the filter coefficients $h_j$ will be selected so as to cause the resultant signal Y* 108 to be "closer" to the clean forward signal Y 106 than corrupted forward signal X 104. For at least one optimal combination of filter coefficients, the resultant signal Y* 108 will be at its "closest" to the clean forward signal Y 106.

It is sometimes convenient to define "closeness" in terms of a least-squares problem. In particular, the optimal filter coefficients are obtained by solving an optimisation problem whose object it is to minimise, from among all possible combinations of filter coefficients $h_j$, the mean square difference between instantaneous values of the resultant signal Y* 108 and the clean forward signal Y 106. The actual value of the minimum mean-square error is typically not as important as the value of the optimal filter coefficients that allow such minimum to be reached.

A reasonable assumption is that noise signal E 114 adds energy to forward signal Y 106. Therefore an expression of the least square problem is to minimise the resultant signal Y* 108. Mathematically, the problem in question can be defined as follows:

$$\min_{\underline{h}} E[(y_k^*)^2]_t,\qquad \text{Equation 4}$$

where $E[\circ]_t$ denotes the expectation of the quantity "$\circ$" over a subset of time up until the current sample time t. For the purpose of this specific example, the expression $E[\circ]_t$, will denote the summation of the quantity "$\circ$" over a subset of time up until the current sample time t. Another commonly used notation is $\Sigma[\circ]_t$. Therefore, for the purpose of this example the expressions $E[\circ]_t$ and $\Sigma[\circ]_t$ are used interchangeably.

Now, from FIG. 1 it is noted that:

$$y_k^* = x_k - f_k = x_k - \underline{h}_k^T \underline{z}_k \qquad \text{Equation 5}$$

and $$x_k = y_k + e_k. \qquad \text{Equation 6}$$

Therefore, the problem stated in Equation 4 becomes:

$$\min_{\underline{h}} E[(x_k - \underline{h}^T \underline{z}_k)^2]_t, \qquad \text{Equation 7}$$

Expanding the term in square brackets, one obtains:

$$(x_k - \underline{h}^T \underline{z}_k)^2 = x_k^2 - 2x_k \underline{h}^T \underline{z}_k + (\underline{h}^T \underline{z}_k)^2. \qquad \text{Equation 8}$$

Taking the expected value of both side of equation 8, one obtains:

$$E[(x_k - \underline{h}^T \underline{z}_k)^2]_t = E[x_k^2]_t - 2E[x_k \underline{h}^T \underline{z}_k]_t + E[\underline{h}^T \underline{z}_k \underline{z}_k^T \underline{h}]_t \qquad \text{Equation 9}$$

Minimizing the above quantity leads to a solution for which the resultant signal Y* 108 will be at its minimum and likely at its "closest" to the clean forward signal Y 106. To minimize this quantity, one takes the derivative of the right-hand side of Equation 9 with respect to the filter coefficient vector $\underline{h}$ and sets the result to zero, which yields the following:

$$\frac{d}{d\underline{h}}(E[x_k^2]_t - E[2x_k \underline{h}^T \underline{z}_k]_t + E[\underline{h}^T \underline{z}_k \underline{z}_k^T \underline{h}]_t) = \qquad \text{Equation 10}$$
$$-2E[x_k \underline{z}_k]_t + 2E[\underline{z}_k \underline{z}_k^T \underline{h}]_t = 0.$$

Thus, an "optimal" set of filter coefficients $h^*_j$ solves the set of equations defined by:

$$E[\underline{z}_k \underline{z}_k^T] \underline{h}^* = E[x_k \underline{z}_k]_t. \qquad \text{Equation 11}$$

It is noted that equation 11 expresses the filter coefficient optimisation problem in the form $Ah=B$, where $A = E[\underline{z}_k \underline{z}_k^T]_t$ and $B = E[x_k \underline{z}_k]_t$ and that the matrix A is symmetric and positive definite for a non-trivial signal Z 102. The usefulness of these facts will become apparent to a person of ordinary skill in the art upon consideration of later portions of this specification.

In a non-limiting example, matrix A is a matrix of dimension N×N and B is a vector of M elements where M is generally greater or equal to N (M≧N). If M=N, a single vector $\underline{h}^*$ can be computed from the equation 11. If M>N, then a plurality of vectors h* can be computed, where each vector $\underline{h}^*$ is associated to a respective subset of N elements of vector B. Each subset of N elements is associated to a particular segment of signal X 104. The segments of signal X 104 associated to the subsets of N elements of vector B may be overlapping or mutually exclusive without detracting from the spirit of the invention. One set of filter coefficients from the plurality of vectors h* can then be selected for release to filter 110. Specific examples of the manner in which the one set of filter coefficients may be selected from the plurality of vectors h* will be described later on in the specification.

It can be noted that signal X=signal Y+signal E, and that the above equation 11 can be rewritten as follows:

$$E[\underline{z}_k \underline{z}_k^T] \underline{h}^* = E[(y_k + e_k) \underline{z}_k]_t.$$

$$E[\underline{z}_k \underline{z}_k^T] \underline{h}^* = E[e_k \underline{z}_k]_t + E[y_k \underline{z}_k]_t \qquad \text{Equation 12}$$

In other words, we can separate the filter function defined by the set of filter coefficients $h^*_j$, $0 \leq j \leq N-1$ into two components. The first term on the right hand side of the equation $E[e_k \underline{z}_k]_t$ contributes to the desired filter behaviour since the filter 110 tries to obtain a filter such that signal F 112 equals signals E 114. Therefore, the second term on the right hand side of the equation $E[y_k \underline{z}_k]_t$ contributes to the error behaviour of the filter 110. Therefore the error function can be expressed as follows:

$$E[\underline{z}_k \underline{z}_k^T]_t \underline{\text{error\_function}}^* = E[y_k \underline{z}_k]_t. \qquad \text{Equation 13}$$

It will be readily observed that where signal Z 102 and signals Y 106 are perfectly uncorrelated, i.e. $E[y_k z_k]_t = 0$ for all t, the error function is zero.

It is noted that since the properties of the signals Z 102 and X 104 change with time, so too does the optimal combination of filter coefficients $h^*_j$, $0 \leq j \leq N-1$, which solves the above problem in Equation 11.

It is also appreciated that the state of system 150 and therefore the transfer function may also change over time and consequently, is a further factor in the optimal combination of filter coefficients $h^*_j$, $0 \leq j \leq N-1$.

Specific examples of the manner in which the changes in the state of system 150 and in the optimal combination of filter coefficients $h^*_j$, $0 \leq j \leq N-1$, are detected will now be described in greater detail with reference to FIG. 2, which depicts the filter adaptation unit 100 in greater detail.

Filter Adaptation Unit 100

The filter adaptation unit 100 includes a first input 252 for receiving a sequence of samples of a first signal Z 102, a second input 254 for receiving a sequence of samples of a second signal X 104, a coefficient generation unit 200, an error characterization unit 202, a coefficient set selection unit 204 and an output 256 for releasing an output signal indicative of a set of filter coefficients H 116. The filter adaptation unit 100 also includes a memory unit 240 for storing the last active set of filter coefficients selected by the coefficient set selection unit 204 along with a corresponding set of error characterization data elements.

Coefficient Generation Unit 200

The coefficient generation unit 200 receives the first signal Z 102 and the second signal X 104 from the first input 252 and the second input 254 respectively. The coefficient generation unit 200 is operative to generate a set of filter coefficients Hnew 206 at least in part on the basis of the first and second signals. In a specific example, the coefficient generation unit 200 applies a least squares method on the first and second signals to derive the set of filter coefficients Hnew 206. The coefficient generation unit 200 generates a set of coefficients Hnew 206 by solving equation 11 reproduced below:

$$E[z_k z_k^T]_t \underline{h}^* = E[x_k z_k]_t.$$  Equation 11

Figure 2:
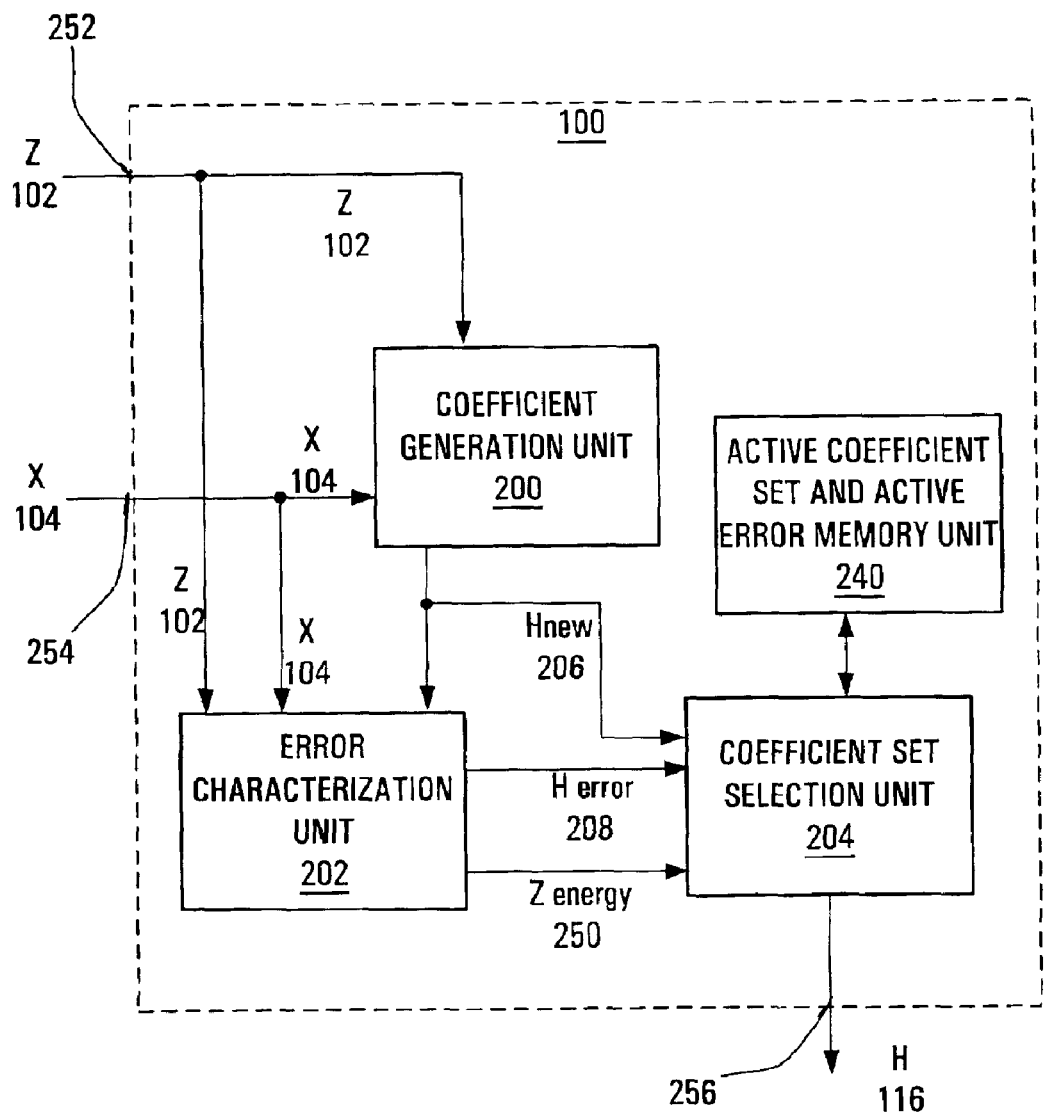
FIG. 2 is a block diagram of the filter adaptation unit of FIG. 1 in accordance with a specific example of implementation of the invention including a coefficient generation unit 200, an error characterization unit 202 and a coefficient set selection unit 204.

The coefficient generation unit 200 releases a new set of filter coefficients $h^*_j$, designated as Hnew 206 in FIG. 2.

Other specific examples of implementation of the coefficient generation unit 200 is described in United States patent application entitled, "Method and Apparatus for Generating a Set of Filter Coefficients for a Time Updated Adaptive Filter", filed on the same date as the instant application by Awad T. et al. The contents of this document are hereby incorporated by reference.

Figure 3:
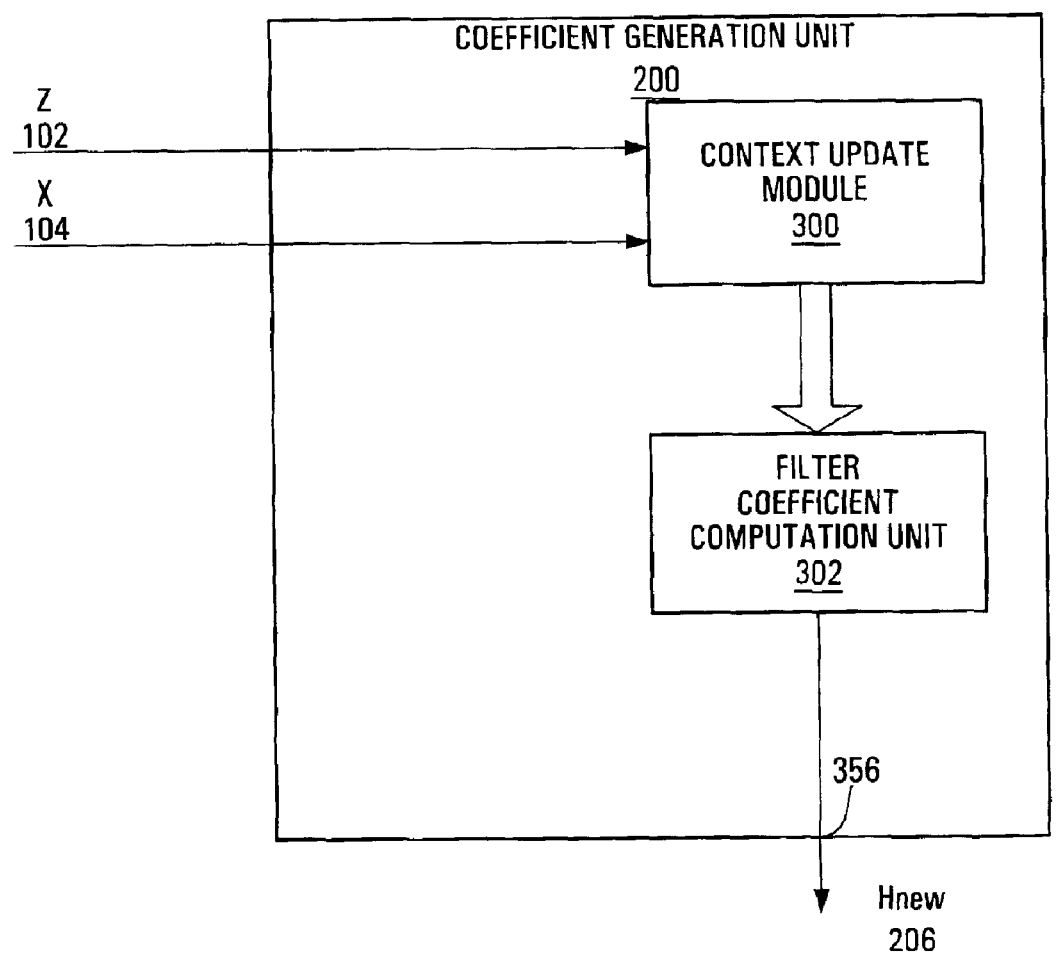
FIG. 3 is a functional block diagram of the coefficient generation unit 200 of FIG. 2 in accordance with an example of implementation of the invention.

FIG. 3 shows a specific non-limiting implementation of the coefficient generation unit 200. As shown, the coefficient generation unit 200 includes a context update module 300 and a filter coefficient computation unit 302.

The context update module 300 receives the sequence of samples of the first signal Z 102 and the sequence of samples of the second signal X 104. The context update module 300 generates and maintains contextual information of the first signal Z 102 and the second signal X 104. The context update module 300 maintains sufficient contextual information about signals Z 102 and X 104 to be able to derive $E[z_k z_k^T]_t$ and $E[x_k z_k]_t$ for the current time t. For each new received sample of signals Z 102 and X 104 the contextual information is updated. This contextual information is then used by the filter coefficient computation unit 302 to generate the set of filter coefficients Hnew 206. The specific realization of the context update module 300 may vary from one implementation to the other without detracting from the spirit of the invention. For the purpose of this description, the contextual information comprises a first set of data elements and a second set of data elements, where the first set of data elements is indicative of the auto-correlation of signal Z 102 $E[z_k z_k^T]_t$. The second set of data elements is a set of cross-correlation data elements $E[x_k z_k]_t$ of the first signal Z 102 with the second signal X 104. The first set of data elements and the second set of data elements may be periodically cleared to remove "old" samples from the context update module. In a non-limiting example used in the context of echo cancellation, the first set of data elements and the second set of data elements are cleared every minute.

The filter coefficient computation unit 302, makes use of the contextual information provided by the context update module 300 to generate the set of filter coefficients Hnew 206. The frequency of the computation of the new set of filter coefficients Hnew 206 may vary from one implementation to the other without detraction from the spirit of the invention. In a non-limiting example, a new set of filter coefficients Hnew 206 is computed every L samples of signals Z 102, where L is >=2. The filter coefficient computation unit 302 solves equation 11 reproduced below:

$$E[z_k z_k^T]_t \underline{h}^* = E[x_k z_k]_t.$$  Equation 11

In a non-limiting example, the first set of data element can be represented by an N×N matrix "A" describing the expected auto-correlation of signal Z 102, $E[z_k z_k^T]_t$. Matrix "A" is symmetric and positive definite. The second set of data elements, indicative of the expected cross-correlation between signal Z 102 and signal X 104, can be represented by a vector "B" of M elements, $E[x_k z_k]_t$. Finally the set of filter coefficients can be represented by a third vector $\underline{h}^*$. The relationship between "A", "B" and $\underline{h}^*$ can be expressed by the following linear equation:

$$A\underline{h}^* = B$$  Equation 14

There are many known methods that can be used to solve a linear equation of the type described in the above equation and consequently these will not be described further here. If M=N, a single vector $\underline{h}^*$ can be computed from the above equation. Therefore, in the case where N=M, Hnew 206 is one set of filter coefficients associated to a single segment of signal X 104. If M>N, a vector $\underline{h}^*$ can be computed for each subset of N elements of vector "B", where each vector $\underline{h}^*$ is associated to a particular segment of signal X 104 included in the subset of N elements of vector "B". It is to be noted that the segments of signal X 104 associated to the subsets of N elements of vector "B" may be overlapping or mutually exclusive without detracting from the spirit of the invention.

For a same N×N matrix A, when M>N, a plurality of subsets of N elements of vector "B" are used to generate a plurality of vectors $\underline{h}^*$, each vector $\underline{h}^*$ being generated by the filter coefficient computation unit 302 by solving the above equation for a respective subset of N elements of vector B. Therefore, in the case where N<M, Hnew 206 includes a plurality of sets of filter coefficients. Hnew 206 can be expressed as a vector of sets of filter coefficients Hnew[i], for i=0 . . . FC-1, where FC is the number of sets of filter coefficients generated by solving equation 14, where each set of filter coefficients is associated to a respective segment of signal X 104. For example, the first set of filter coefficients Hnew[0], is generated on the basis of a first subset of the elements of vector B, namely B[0 . . . N-1]. The second set of filter coefficients Hnew[1], is generated on the basis of a second subset of the elements of vector B, namely B[r . . . N-r-1] and so on and the last set of filter coefficients Hnew[FC-1] is generated on the basis of a last subset of the elements of vector B[N-M . . . M-1].

Advantageously, it will be noted that although each set of filter coefficients Hnew[i] is generated on the basis of a respective subset of N elements of vector B, all sets of filter coefficients Hnew[i], for i=0 . . . FC-1 make use of a same N×N auto-correlation matrix A. This allows modelling a system 150 over a time delay of M samples of signal X 104 while solving equation 14 with a same matrix A of size N×N. Specific examples of the manner in which a set of filter coefficients is selected from Hnew[i], for i=0 . . . FC-1, will be described in greater detail later on in the specification.

Hnew 206 is generated on the basis of the contents of the context update module which includes data derived from a first subset of samples of signal Z 102 and a first subset of samples of signal X 104. Hnew 206 is associated to an ordering data element, which will be referred to as Hnew_age, indicating the time of receipt of the first sample of signal Z 102 that was included in the computation of Hnew 206. In a non-limiting example, when M>N, all sets of filter coefficients in Hnew[i], i=0 . . . FC-1, generated are assigned the same ordering data element, Hnew_age.

Hnew 206 is then released at the output 356 of the coefficient generation unit.

Error Characterization Unit 202

In accordance with a specific implementation, the error characterization unit 202 characterizes the error function associated with adaptive filter 170 on the basis of the knowledge of the amplitude of the first signal Z 102 and of an estimate of the amplitude of the forward signal Y 106.

Theoretical Explanation

As was described previously, the error function can be expressed by equation 13 reproduced below:

$$E[z_k z_k^T]_t \text{error\_function}^* = E[y_k z_k]_t. \quad \text{Equation 13}$$

In order to characterize the error function of the adaptive filter 170, a single tap filter is considered. In a single point tap system where $E[z_i z_i^T]_t$ has a single data element and $E[y_i z_i]_t$ has a single data element, equation 13 can be written as follows:

$$\sum_{i=0}^{t-1} z_i z_i \text{error\_function} = \sum_{i=0}^{t-1} z_i y_i. \quad \text{Equation 15}$$

Solving for the error function at time t we obtain:

$$\text{error\_function}(t) = \frac{\sum_{i=0}^{t-1} z_i y_i}{\sum_{i=0}^{t-1} z_i z_i} \quad \text{Equation 16}$$

where t is the current sample time;

$z_k$ is a sample of the return signal Z 102 at time k; and $y_k$ is a sample of the return signal Y 106 at time k;

For the purpose of deriving a mathematical model to characterize the error function, an assumption is made that signal Z 102 and signal Y 106 are substantially independent of one another and are white. For the purpose of this specification, a signal S is white if $E(S_i S_j) \approx 0$ for $i \neq j$ and signals S and Q are independent if $E(S_i Q_j) \approx 0$ for all i,j. The above assumptions allow considering that the error added by each sample pair is an independent variable which can be described by the following expression:

$$\text{error}_k = \frac{z_k y_k}{z_k z_k} \quad \text{Equation 17}$$

where $z_k$ and $y_k$ are the kth samples of signals Z 102 and Y 106 respectively and $\text{error}_k$ is the kth component of the error function due to the kth samples of signals Z 102 and Y 106. The error function can be considered as the sum of the errors added by the samples. In statistics, the above described error function can be considered to be a random variable. In order to characterize this random variable, the mean and the variance (or alternatively the standard deviation) can be computed. Since signal Z 102 and signal Y 106 are assumed to be independent, the mean of this random variable is 0 and it will be shown below that the standard deviation can be given by:

$$\sigma_t = \frac{\left(\sum_{i=0}^{t-1}(z_i y_i)^2\right)^{\frac{1}{2}}}{\left[\left(\sum_{i=0}^{t-1} z_i z_i\right)^2 - \left(\sum_{i=0}^{t-1}(z_i z_i)^2\right)\right]^{\frac{1}{2}}} \quad \text{Equation 18}$$

Deriving the Standard Deviation Equation

The error inserted at each pair of samples $\{z_i, y_i\}$ can be represented mathematically by the following:

$$\text{error} = \frac{z_i y_i}{z_i z_i} \quad \text{Equation 19}$$

If the error components inserted at each pair of samples are equal to one another and are assigned equal weight, standard deviation of the error function after t samples can be expressed by the following expression:

$$\sigma_t = \frac{\text{error}}{\sqrt{t}} \text{ where } t \text{ is the number of samples} \quad \text{Equation 20}$$

and *error* is the error per sample

When each sample has an error that is different from the other and has a different weight, the standard deviation of the error function can be expressed as the division of two terms namely the average error over time and the number of samples conditioned by the weight. The average standard deviation of the error function can be expressed as follows:

$$\sigma_A = \frac{\left(\sum_{i=0}^{t-1}(\text{error}_{ii} * w_i)^2\right)^{\frac{1}{2}}}{\left(\sum_{i=0}^{t-1} w_i^2\right)^{\frac{1}{2}}} \quad \text{Equation 21}$$

where $w_i$ is a weight value associated to a given error component. The square root of the number of samples conditioned by the weight which corresponds to $\sqrt{t}$ of Equation 20:

$$\text{Sample number} = \frac{\sum_{i=0}^{t-1} w_i}{\left(\sum_{i=0}^{t-1} w_i^2\right)^{\frac{1}{2}}} \quad \text{Equation 22}$$

Therefore the standard deviation computation can be reduced to the following expression:

$$\sigma_t = \frac{\left(\sum_{i=0}^{t-1}(\text{error}_i * w_i)^2\right)^{\frac{1}{2}}}{\sum_{i=0}^{t-1} w_i} \quad \text{Equation 23}$$

In a least squares context, the weight $w_k$ of the error for each sample k is $z_k z_k$. Therefore, in the current specific example, the standard deviation of the error function can be expressed as follows:

$$\sigma_t = \frac{\left(\sum_{i=0}^{t-1} \left(\frac{z_i y_i}{z_i z_i} * z_i z_t\right)^2\right)^{\frac{1}{2}}}{\sum_{i=0}^{t-1} z_i z_i} \quad \text{Equation 24}$$

which can be reduced to the following:

$$\sigma_t = \frac{\left(\sum_{i=0}^{t-1} (z_i y_i)^2\right)^{\frac{1}{2}}}{\sum_{i=0}^{t-1} z_i z_i} \quad \text{Equation 25}$$

In statistics, it is well known that when an unbiased estimator of the variance (or standard deviation) of a set of sample is to be obtained, the sample number is reduced by "1" to obtain an unbiased effective sample set. The effective sample set can be expressed by:

$$\text{Effective Sample number} = \left[\frac{\left(\sum_{i=0}^{t-1} w_i\right)^2}{\left(\sum_{i=0}^{t-1} w_i^2\right)} - 1\right]^{\frac{1}{2}} \quad \text{Equation 26}$$

Therefore the standard deviation computation can be reduced as follows:

$$\sigma_t = \frac{\left(\sum_{i=0}^{t-1} (error_i * w_i)^2\right)^{\frac{1}{2}}}{\left(\sum_{i=0}^{t-1} w_i^2\right)^{\frac{1}{2}}} * \frac{1}{\left[\frac{\left(\sum_{i=0}^{t-1} w_i\right)^2}{\left(\sum_{i=0}^{t-1} w_i^2\right)} - 1\right]^{\frac{1}{2}}} \quad \text{Equation 27}$$

$$\sigma_t = \frac{\left(\sum_{i=0}^{t-1} (error_i * w_i)^2\right)^{\frac{1}{2}}}{\left(\sum_{i=0}^{t-1} w_i^2\right)^{\frac{1}{2}}} * \frac{\left(\sum_{i=0}^{t-1} w_i^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \quad \text{Equation 28}$$

$$\sigma_t = \frac{\left(\sum_{i=0}^{t-1} (error_i * w_i)^2\right)^{\frac{1}{2}}}{\left[\left(\sum_{i=0}^{t-1} w_i\right)^2 - \left(\sum_{i=0}^{t-1} w_i^2\right)\right]^{\frac{1}{2}}} \quad \text{Equation 29}$$

In a least squares context, the weight $w_k$ of the error for each sample k is $z_k z_k$. Therefore, in this second specific example, the standard deviation of the error function can be expressed as follows:

$$\sigma_t = \frac{\left(\sum_{i=0}^{t-1} (z_i y_i)^2\right)^{\frac{1}{2}}}{\left[\left(\sum_{i=0}^{t-1} z_i z_i\right)^2 - \left(\sum_{i=0}^{t-1} (z_i z_i)^2\right)\right]^{\frac{1}{2}}} \quad \text{Equation 30}$$

For the purpose of a specific implementation, equation 30 is used to characterize the standard deviation of the error function.

Adjustments for the Assumptions

As previously indicated, the above computations are based on the assumption that signals Z 102 and Y 106 are white and independent. The assumption that signal Z 102 and signal Y 106 are independent is reasonable for many applications of adaptive filtering. It will be readily appreciated that when signal Z 102 and signal Y 106 are not exactly independent, the computations described in this specification may nevertheless be used with the knowledge that certain errors factors may be introduced by this approximation.

However, the assumption that signals Z 102 and Y 106 are white is not true in most applications. In order to solve this problem, signals Z 102 and Y 106 are divided spectrally into a set of frequency bands, where signal Z 102 and Y 106 can be considered to generally be substantially white within a given frequency band. In the non-limiting example of implementation of an echo cancellor, the signals Z 102 and Y 106 (assuming a sampling rate of 8000 samples/sec and therefore a frequency spectrum from 0–4000 Hz) are divided into 257 frequency bands of 15.625 Hz each. Using heuristics measurements, this width has been found to be narrow enough that voice is approximately a white signal across each of the 15.625 Hz bands. The width of the bands may vary from one application to another without detracting from the spirit of the invention. The "whiteness" of the signal is a subjective quality and depends on the nature of the signals being processed. The error function is then characterized for each frequency band independently using the above described computation to estimate the mean (which is 0) and the standard deviation. For each frequency band, the standard deviation of the error function can be computed as follows:

$$\sigma_t[j] = \frac{\left(\sum_{i=0}^{t-1} (z_i[j] y_i[j])^2\right)^{\frac{1}{2}}}{\sum_{i=0}^{t-1} z_i[j] z_t[j]} \quad \text{Equation 31}$$

where z[j] and y[j] is the amplitude of the component of signal Z 102 and signal Y 106 respectively in frequency band j and $\sigma_t[j]$ is the standard deviation of the error function in frequency band j at time t.

Another assumption in the above computations is that the amplitude (or energy) of signal Y 106 is known. However, signal Y 106 is unknown since, if signal Y 106 were known, the adaptive filter 170 would serve no practical purpose. The amplitude of signal Y 106 can be approximated by the amplitude of signal Y* 108. More specifically, in a least squares system, the forward signal Y 106 can be considered as made up of two (2) components, namely a first component Yc which is correlated with signal Z 102 and a second component Yu which is uncorrelated with signal Z 102. Because, by definition, Yc and Yu are uncorrelated, the energy of forward signal Y 106 is equal to the sum of the energies of Yc and Yu. Mathematically, this can be expressed as follows:

$$Yenergy = Ycenergy + Yuenergy \qquad \text{Equation 32}$$

The filter 110 in combination with adder 180 will generally eliminate signal Yc. Therefore, the energy of signal Y* 108 will be essentially equal to the Yu energy which is less than or equal to the energy of signal Y 106. Therefore, since signal Y 106 is not available, the energy of signal Y* 108 is used as an approximation of the energy of signal Y 106. For each frequency band, the standard deviation of the error function using Y* 108 can be computed as follows:

$$\sigma_t[j] = \frac{\left(\sum_{i=0}^{t-1}(z_i[j]y_i^*[j])^2\right)^{\frac{1}{2}}}{\left[\left(\sum_{i=0}^{t-1} z_i[j]z_i[j]\right)^2 - \left(\sum_{i=0}^{t-1}(z_i[j]z_i[j])^2\right)\right]^{\frac{1}{2}}} \qquad \text{Equation 33}$$

Finally, although the above described standard deviation computations have been derived for an adaptive system having a single tap filter, similar derivations may be effected for a filter having N taps. In a practical application, for a filter having N taps, the standard deviation computation becomes:

$$\sigma_t[j] = \frac{\left(\sum_{i=0}^{\frac{t}{N}-1}(z_{N*i}[j]y_{N*i}^*[j])^2\right)^{\frac{1}{2}}}{\left[\left(\sum_{i=0}^{\frac{t}{N}-1} z_{N*i}[j]z_{N*i}[j]\right)^2 - \left(\sum_{i=0}^{\frac{t}{N}-1}(z_{N*i}[j]z_{N*i}[j])^2\right)\right]^{\frac{1}{2}}} \qquad \text{Equation 34}$$

In view of the above description, deriving a standard deviation computation for N>1 will be readily apparent to the person skilled in the art and as such will not be described further.

Specific Implementation

As depicted in FIG. 2, the error characterization unit 202 receives the first signal Z 102, the second signal X 104 and the new set of filter coefficients Hnew 206 from the coefficient generation unit 200. The error characterization unit 202 is operative to generate at least in part on the basis of the first signal Z 102 and the second signal X 104 a set of error characterization data elements Herror 208 associated to the new set of filter coefficients Hnew 206. The error characterization unit 202 characterizes the error on a per-frequency band basis. Each error characterization data element in Herror 208 is a statistical estimate of the error function standard deviation for a respective frequency band.

Figure 4:
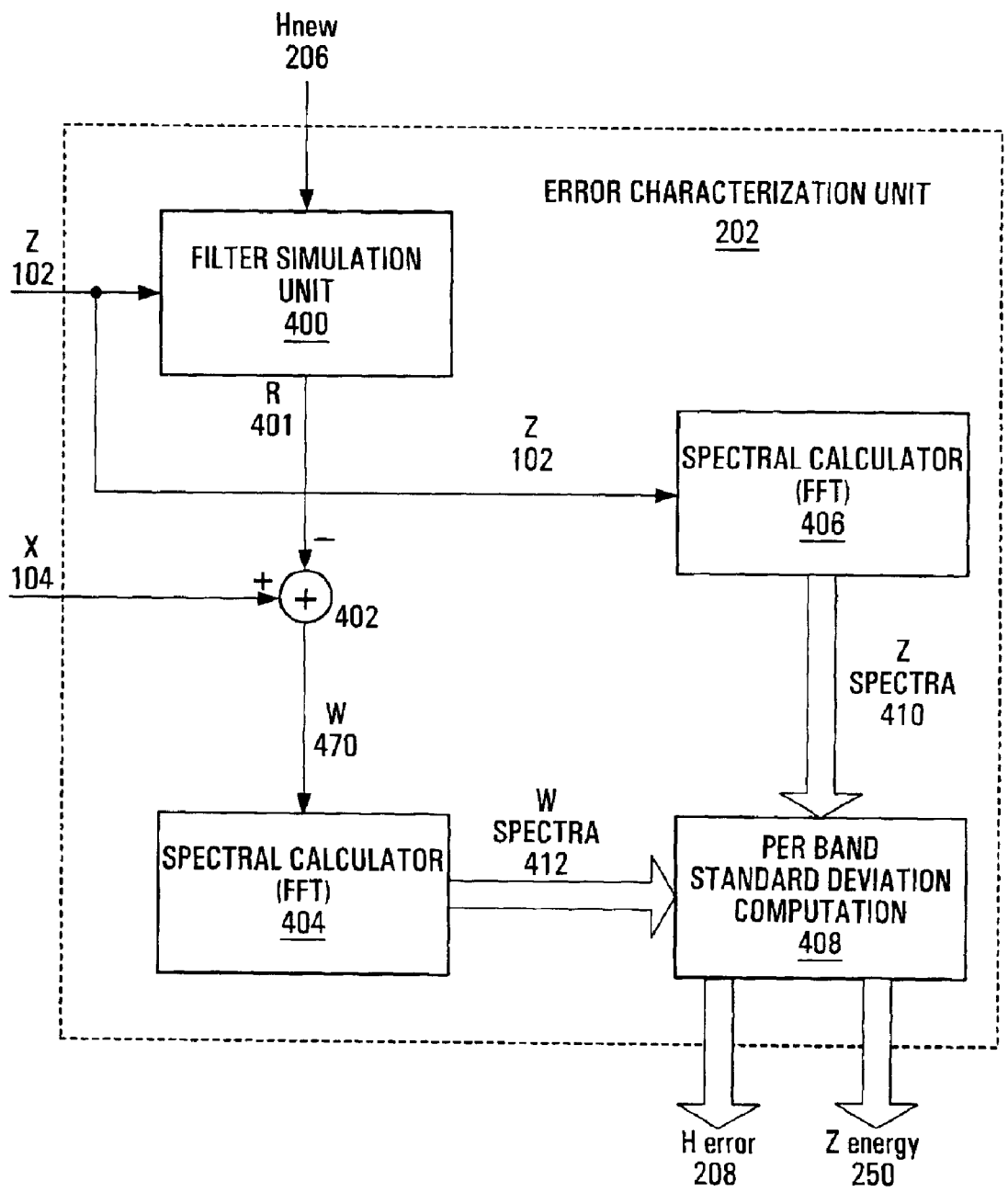
FIG. 4 is a functional block diagram of the error characterization unit of FIG. 2 in accordance with an example of implementation of the invention.

FIG. 4 shows a specific example of implementation of the error characterization unit 202 including a filter simulation unit 400, an adder unit 402, a first spectral calculator 406, a second spectral calculator 404 and a per-band standard deviation computation unit 408.

The filter simulation unit 400 is suitably embodied as an adaptive digital filter and simulates the processing of filter 110 shown in FIG. 1. The filter simulation unit 400 taps the return signal Z 102, and receives the new set of filter coefficients Hnew 206 from the coefficient generation unit 200. The filter simulation unit 400 applies a filtering operation corresponding to the filter coefficients Hnew 206 to the return signal Z 102 to produce filtered signal R 401. The manner in which the filtering operative is applied was described with regard to filter 110 in FIG. 1 and therefore will not be repeated here.

The output of the filter simulation unit 400, namely the filtered signal R 401, is subtracted by unit 402 on a sample-by-sample basis from the corrupted forward signal X 104 to yield a signal denoted W 470. Signal W 470 is an estimate of signal Y 106 (FIG. 1) generated on the basis of the set of filter coefficients Hnew 206.

First spectral calculator 406 taps the first signal Z 102 and divides the signal into a set of frequency bands. In a non-limiting example, the spectral calculator processes a set of samples of signal Z 102 from which the set of filter coefficients Hnew 206 was generated, where the first sample of the set of samples was taken at normalised time t=1. The spectral calculator 406 applies a set of Fast Fourier Transform (FFT) of length (K−1)*2, each Fast Fourier Transform (FFT) being applied to N of the samples of taps of the adaptive filter 170. The computation of an FFT is well known in the art to which this invention pertains and as such will not be described further herein. For a given time t, the above calculation results into t/N sets of K spectral values of signal Z 102, each spectral value being associated to a respective frequency band from a set of K frequency bands. In a non-limiting example used in echo cancellation, K=257 is used to divide the frequency spectrum of signal Z 102 into 257 frequency bands. If the frequency spectrum goes from 0 Hz to 4000 Hz (assuming a sampling rate of 8000 Hz), then there will be frequency bands centered at 0 Hz, 15.625 Hz, 15.625*2 Hz, 15.625*3 Hz, [ . . . ] and 4000 Hz.

Mathematically, this can be expressed as follows:

$$Z_{SPECTRA} = FFT(z(t)) \qquad \text{Equation 35}$$

$$= \begin{bmatrix} Z_{SPECTRA}(0) \\ Z_{SPECTRA}(1) \\ Z_{SPECTRA}(2) \\ \ldots \\ Z_{SPECTRA}(K-2) \\ Z_{SPECTRA}(K-1) \end{bmatrix}_0 \begin{bmatrix} Z_{SPECTRA}(0) \\ Z_{SPECTRA}(1) \\ Z_{SPECTRA}(2) \\ \ldots \\ Z_{SPECTRA}(K-2) \\ Z_{SPECTRA}(K-1) \end{bmatrix}_1$$

$$\ldots \begin{bmatrix} Z_{SPECTRA}(0) \\ Z_{SPECTRA}(1) \\ Z_{SPECTRA}(2) \\ \ldots \\ Z_{SPECTRA}(K-2) \\ Z_{SPECTRA}(K-1) \end{bmatrix}_{\frac{t}{N}-1}$$

where $$Z_{j,SPECTRA} = \begin{bmatrix} Z_{SPECTRA}(0) \\ Z_{SPECTRA}(1) \\ Z_{SPECTRA}(2) \\ \ldots \\ Z_{SPECTRA}(K-2) \\ Z_{SPECTRA}(K-1) \end{bmatrix}_j$$

where $Z_{SPECTRA}$ 410 is a data structure of t/N vectors each of size K, each vector being indicative of a spectral representation of N samples of signal z(t) and $Z_{SPECTRA}$ (j) is the spectral value of signal Z 102 associated to frequency band j. $Z_{SPECTRA}$ 410 is released by first spectral calculator 406.

Second spectral calculator 404 taps the signal W 470 and divides the signal into a set of K frequency bands. In a non-limiting example, the second spectral calculator 404 processes a set of samples of signal W 470 corresponding to the set of samples of Z 102 processed by first spectral calculator 406, where the first sample of the set of samples of signal W 470 was taken at normalised time t=1. The first spectral calculator 406 applies a set of Fast Fourier Transform (FFT) of length (K−1)*2, each Fast Fourier Transform (FFT) being applied to N of the samples of signal W 470 where N is the number of taps of the adaptive filter 170. The computation of an FFT is well known in the art to which this invention pertains and as such will not be described further herein. For a given time t, the above calculation results into t/N sets of K spectral values of signal W 470, each spectral value being associated to a respective frequency band from a set of K frequency bands. Mathematically, this can be expressed as follows:

$$W_{SPECTRA} = FFT(w(t))$$ Equation 36

$$= \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_0 \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_1 \ldots \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_{\frac{t}{N}-1}$$

where $$W_{j,SPECTRA} = \begin{bmatrix} W_{SPECTRA}(0) \\ W_{SPECTRA}(1) \\ W_{SPECTRA}(2) \\ \ldots \\ W_{SPECTRA}(K-2) \\ W_{SPECTRA}(K-1) \end{bmatrix}_j$$

where $W_{SPECTRA}$ 412 is a data structure of t/N vectors each of size K, each vector being indicative of a spectral representation of N samples signal W 470 and $W_{SPECTRA}(j)$ is the spectral value of signal W 470 associated to frequency band j. $W_{SPECTRA}$ 412 is released by spectral calculator 404.

Methods other than the FFT for dividing a signal into a set of frequency bands may be used by the spectral calculators 404, 406, such as for example, a cosine transform and other similar transforms. Although spectral calculator 406 and spectral calculator 404 are depicted as separate components in FIG. 4, it will be readily appreciated that they may be embodied in a same physical device and may share functional components without detracting from the spirit of the invention.

The per-band standard deviation computation unit 408 receives $W_{SPECTRA}$ 412 and $Z_{SPECTRA}$ 410 and processes each frequency band to generate an error characterization estimate Herror[j] for each band j, for j=0 . . . K−1. In a specific implementation, Herror[j] is the standard deviation of error function for frequency band j. The per-band standard deviation computation unit 808 also generates a per-band energy estimate for signal Z 102, identified as Zenergy 250 in FIG. 8.

Figure 5:
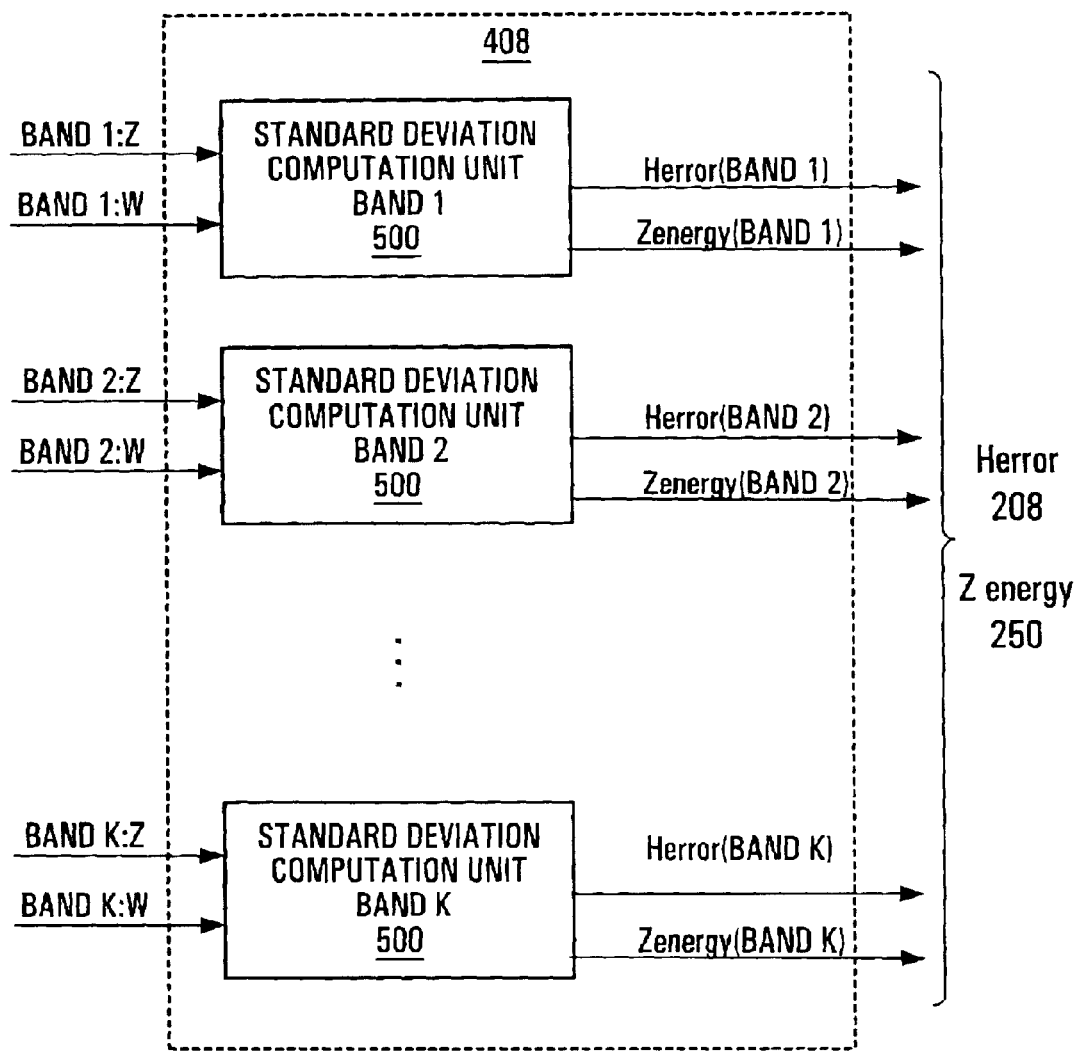
FIG. 5 is a functional block diagram of a standard deviation computation unit suitable for use in the error characterization unit in accordance with a non-limiting example of implementation.

FIG. 5 shows a conceptual block diagram of the per-band standard deviation computation unit 408. As depicted, the per-band standard deviation computation unit 408 includes a set of K parallel computation units 500 where each unit 500 is operative to compute the standard deviation of the error function for a respective frequency band. If the frequency bands are narrow, the signals Z 102 and W 470 can be considered "white" within a frequency band, thereby allowing the following computation to be used:

for $j = 0 \ldots K-1$. Equation 37

$$H_{error}[j] = \frac{\sum_{i=0}^{\frac{t}{N}-1}((W_{i,SPECTRA}[j] \times Z_{i,SPECTRA}[j])^2)^{\frac{1}{2}}}{\left[\left(\sum_{i=0}^{\frac{t}{N}-1} Z_{i,SPECTRA}[j] \times Z_{i,SPECTRA}[j]\right)^2 - \left(\sum_{i=0}^{\frac{t}{N}-1} (Z_{i,SPECTRA}[j] \times Z_{i,SPECTRA}[j])^2\right)\right]^{\frac{1}{2}}}$$

where Herror[j] is the error characterization data element for frequency band j and Herror 208 is a set of K error characterization data elements. Each unit 500 also releases a data element Zenergy[j] indicative of the energy of signal Z 102 in frequency band j and Zenergy 250 is a set of K energy data elements. Zenergy is computed as follows:

$$Z_{energy}[j] = \sum_{i=0}^{\frac{t}{N}-1} (Z_{i,SPECTRA}[j] \times Z_{i,SPECTRA}[j])$$ Equation 38 for $j = 0 \ldots K-1$

The skilled person in the art will readily appreciate that the implementation depicted in FIG. 4 is for the purpose of example only as many other implementations are possible.

Although the above described specific examples of implementations show the computations in the frequency domain of the auto-correlation of signal Z 102 and the cross-correlation of signals Z 102 and W 470, it is to be understood that the equivalent of either of these computations may be effected in the time domain without detracting from the spirit of the invention. For example, the auto-correlation and cross-correlation computations may be effected in the time domain while the computation of the standard deviation is effected in the frequency domain.

Other examples of implementation of the error characterization unit 202 are described in United States Patent Application entitled, "Method and Apparatus for Providing an Error Characterization Estimate of an Impulse Response Derived using Least Squares", filed on the same date as the instant application by Awad T. et al. The content of the above referenced document is hereby incorporated by reference.

In the alternative non-limiting example where Hnew 206 comprises a plurality of sets of filter coefficients, Hnew[i], for i=0 . . . FC-1 , a set of error characterization data elements is generated for each set of filter coefficients in the plurality of sets of filter coefficients using the above described procedure. In this alternative non-limiting example, Herror is comprised of a plurality of sets of error characterization data elements, each set of error characterization data elements being associated to a respective set of filter coefficients. Herror can be expressed as a vector of sets of error characterization data elements Herror[i], for i=0 . . . FC-1, where FC is the number of sets of filter coefficients in Hnew 206.

Figure 6:
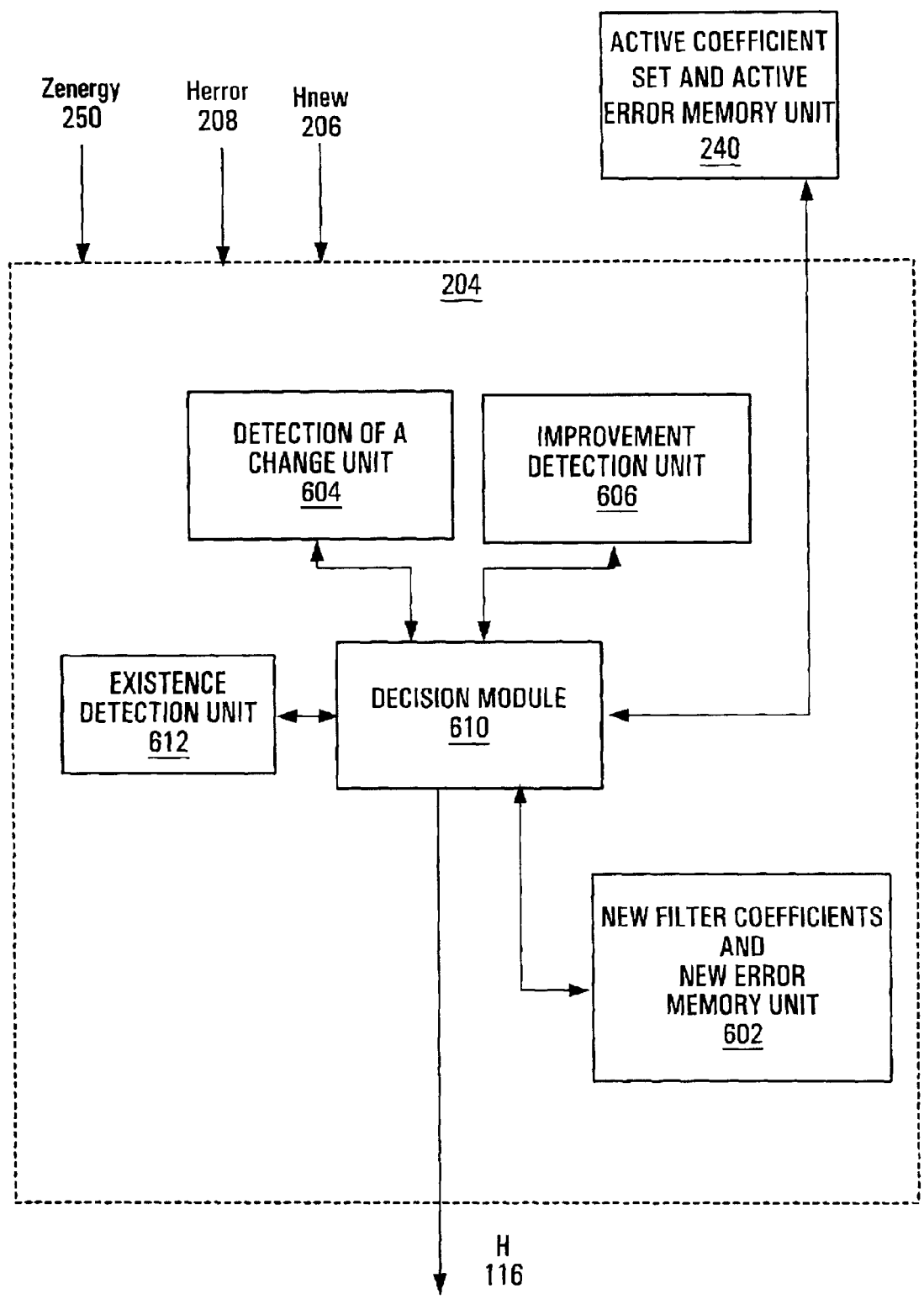
FIG. 6 is a functional block diagram of coefficient set selection unit 204 of FIG. 2 in accordance with an example of implementation of the invention.

Herror 208 and Zenergy 250 are released by the error characterization unit 202 and provided to the coefficient set selection unit 204 depicted in greater detail in FIG. 6.

Active Coefficient Set Memory Unit 240

The active coefficient set memory unit 240 stores a set of filter coefficients most recently selected by the coefficient set selection unit 204, herein referred to as Hbest, along with its associated set of error characterization data elements, herein referred to as Hbest_error. The Hbest_error includes K data elements, each data element being associated to a respective frequency band. The active coefficient set memory unit 240 stores the set of filter coefficients Hbest currently being released to the adaptive filter 110. Hbest is associated to an ordering data element, which will be referred to as Hbest_age, indicating the time of receipt of the first sample of signal Z 102 that was included in the computation of Hbest. At the time Hbest was generated, the context update module 300 (FIG. 3) included data derived from a first subset of samples of signal Z 102 and a first subset of samples of signal X 104. This may be the case when Hnew 206 includes one set of filter coefficients or when Hnew 206 comprises a plurality of sets of filter coefficients, Hnew[i], for i=0 . . . FC-1.

In an alternative non-limiting example where Hnew 206 comprises a plurality of sets of filter coefficients, Hnew[i], for i=0 . . . FC-1, the active coefficient set memory unit 240 Hbest comprises a plurality of sets of filter coefficients, Hbest[i], for i=0 . . . FC-1, most recently selected by the coefficient set selection unit 204. Hbest_error includes a plurality of sets of error characterization data elements, Hbest_error[i], for i=0 . . . FC-1, where each set of error characterization data elements is associated to a corresponding set of filter coefficient in Hbest[i], for i=0 . . . FC-1. In this alternative non-limiting example, one of the plurality of sets of Hbest in the active coefficient set memory unit 240 is currently being released to the adaptive filter 110. Each set of filter coefficients in Hbest is also associated to an ordering data element, Hbest_age, indicating the time of receipt of the first sample of signal Z 102 that was included in the computation of corresponding set of filter coefficients. Hbest_age comprises a plurality of ordering data elements, Hbest_age[i], for i=0 . . . FC-1.

Since Hnew 206 was generated after Hbest, at least some samples of signals Z 102 and X 104 in the first subsets from which Hnew 206 was generated were received by the filter adaptation unit 100 subsequently to all the samples in corresponding first subsets from which Hbest was generated.

Coefficient Set Selection Unit 204

The coefficient set selection unit 204 is operatively coupled to the active coefficient set memory unit 240 to receive Hbest along with its associated set of error characterization data elements, Hbest_error and its corresponding ordering data element Hbest$_{13}$ age. The coefficient set selection unit 204 also receives the set of filter coefficients Hnew 206 generated by the coefficient generation unit 200 as well as the associated ordering data element Hnew_age and the associate set of error characterization data elements Herror 208 generated by the error characterization unit 202. The coefficient set selection unit 204 compares Hnew 206 to Hbest as well as the set of error characterization data elements associated to Hnew 206 and the set of error characterization data elements associated to Hbest in order to select the set of filter coefficients H 116 to be released. The comparison criteria may be based on various criteria designed to select a set of filter coefficients that best describes system 150 (FIG. 1).

The coefficient set selection unit 204 will now be described in greater detail with reference to FIG. 6, which depicts the coefficient set selection unit 204 in greater detail. The coefficient set selection unit 204 includes memory unit 602, a detection of a change unit 604, an improvement detection unit 606, an existence detection unit 612 and a decision module 610.

The memory unit 602 receives and stores Hnew 206, its associated set of error characterization data elements Herror 208 and its associated ordering data element Hnew_age.

Detection of a Change Unit 604

The detection of a change unit 604 attempts to determine the likelihood that differences between a first set of filter coefficients $H_1$ and a second set of filter coefficients $H_2$ can be attributed to general statistical variability in the impulse response of a same state of system 150.

In a non-limiting example, the detection of a change unit 604 receives from the decision module 610 one set of filter coefficients $H_1$ associated to Hbest and one set of filter coefficients $H_2$ associated to Hnew, 206 along with their corresponding sets of error characterization data elements and ordering data elements.

In a specific implementation, the ordering data element associated to $H_2$, namely $H_2$_age, and the ordering data element associated to $H_1$, namely $H_1$_age, are first compared to determine whether $H_2$ is associated to an ordering data element indicating a later time of receipt than the ordering data element associated to $H_1$. More specifically, if $H_2$ is associated to an ordering data element indicating an earlier time of receipt than the ordering data element associated to $H_1$, the detection of a change unit 604 releases a signal indicating that no change has been detected to the decision module 610. If $H_2$ is associated to an ordering data element indicating a later time of receipt than the ordering data element associated to $H_1$, the detection of a change unit proceeds with the processing described below. The above test allows reducing the likelihood of older data causing the detection of a change in the state of the system where a set of filter coefficients based on newer data has already been obtained.

In a non-limiting example, $H_2$ and $H_1$ are divided into a set of K frequency bands. For each frequency band, the amplitudes of $H_2$ and $H_1$ are compared. More specifically, for each frequency band in the set of frequency bands, a first distance measure data element indicative of the difference in the spectral domain between the amplitudes of $H_2$ and $H_1$ is computed. Mathematically, this can be expressed as follows:

$$\text{DISTANCE\_AMPLITUDE}[j] = \text{Distance}(H_1[j], H_2[j]) \text{ for } j=0 \ldots K-1 \quad \text{Equation 39}$$

where Distance(x, y) is a distance computation between two complex numbers, $H_1[j]$ and $H_2[j]$ are the components in frequency band j of $H_1$ and $H_2$ respectively, and DISTANCE_AMPLITUDE is a set of K first distance measure data elements.

The sets of error characterization data elements $H_1$_error and $H_2$_error are also processed. In this specific implementation, each error characterization data element includes a standard deviation data element. More specifically, for each frequency band in the set of frequency bands, a second distance measures data element indicative of the sum of the standard deviation data elements of $H_1$_error and $H_2$_error is generated. Mathematically, this can be expressed as follows:

$$\text{ERROR\_RANGE}[j] = H_1\text{error}[j] + H_2\text{error}[j]) \text{ for } j=0 \ldots K-1 \quad \text{Equation 40}$$

Alternatively, since $H_1$ was generated on the basis of older samples of signals Z 102 and X 104 and $H_1$_error is static and is not affected by newer samples, $H_1\_error$ is not necessarily indicative of the performance of the set of filter coefficients $H_1$ on the current samples of Z 102. Consequently, in this alternative implementation, $H_1\_error$ can be removed from equation 40 indicating that no variation can be accepted on $H_1$. Mathematically, this can be expressed as follows:

$$\text{ERROR\_RANGE}[j] = H_2 \text{error}[j] \text{ for } j=0 \ldots K-1 \quad \text{Equation 41}$$

Following this, for each frequency band in the set of frequency bands, the ratio of the difference between the amplitudes of $H_2$ and $H_1$ and the sum of the standard deviation of the error function is calculated. Mathematically, this can be expressed as follows:

$$RATIO[j] = \frac{\text{DISTANCE\_AMPLITUDE}[j]}{\text{ERROR\_RANGE}[j]} \quad \text{Equation 42}$$

$$\text{for } j = 0 \ldots K-1$$

If the ratio for a given frequency band is greater than 1, then it can be concluded that it is likely that $H_2$ and $H_1$ are inconsistent for the frequency band being considered. For the set of K ratio, statistical methods can be used to determine where the ratios are located.

In a first non-limiting implementation, the set of ratios is attributed to a Gaussian distribution and well-known statistical tests are performed to determine the likelihood that the observed distribution of ratios are indicative of a distribution of ratios greater than 1 with a given confidence level X %. If the statistical tests indicate that the observed distribution of ratios are indicative of a distribution of ratios greater than 1 with a given confidence level X %, then the detection of a change unit 604 releases a signal to the decision module 610 indicating that a change has been detected. Otherwise, the detection of a change unit 604 releases a signal to the decision module 610 indicating that no change has been detected.

In a second non-limiting example, a sum of the Zenergy 250 values for each frequency bands where the ratio is greater than a certain ratio threshold is computed and compared against a threshold. The sum is then compared to a portion of total energy of signal Z to determine whether a change in the state of system 150 has likely occurred. Mathematically this can be expressed as follows:

RATIO_SUM=0 for $j=0 \ldots K-1$

If RATIO[j]>α

$$\text{RATIO\_SUM} = \text{RATIO\_SUM} + \text{Zenergy}[j] \quad \text{Equation 43}$$

$$\text{TOTAL\_Zenergy} = \sum_{j=0}^{K-1} \text{Zenergy}[j] \quad \text{Equation 44}$$

where α is a certain ratio threshold. The ratio threshold α may be selected on the basis of trial and error or on the basis of heuristic performance measurements. In non-limiting implementation, α is set to about "1" however other values are possible without detracting from the spirit of the invention.

If RATIO_SUM is greater than a certain percentage of the Total_Zenergy, then the detection of a change unit 604 releases a signal to the decision module 610 indicating that a change has been detected. Otherwise, the detection of a change unit 604 releases a signal to the decision module 610 indicating that no change has been detected. The certain percentage is established by trial and error based on the percentage that gives the best results.

Improvement Detection Unit 606

The improvement detection unit 606 selects the set of filter coefficients that minimizes the error over all the frequency bands.

In a non-limiting example, the improvement detection unit 606 receives from the decision module 610 one set of filter coefficients $H_1$ associated to Hbest and one set of filter coefficients $H_2$ associated to Hnew 206, along with their corresponding sets of error characterization data elements, $H_1\_error$ and $H_2\_error$ respectively.

More generally, the improvement detection unit 606 selects the set of filter coefficients that minimize a weighted sum of the error characterization data elements over all the frequency bands. Mathematically, this second example may be expressed as follows:

If Weighted($H_2$error) ≤ Weighted($H_1$error)

then change else no change $\quad$ Equation 45 where $$\text{Weighted}(H_2 error) = \sum_{j=0}^{K-1} w_j H_2 error[j]^2$$

$$\text{Weighted}(H_1 error) = \sum_{j=0}^{K-1} w_j H_1 error[j]^2$$

where $w_j$ is a weight associated to frequency band j. In a specific example of implementation, the weight $w_j$ is the energy of signal Z for frequency band j, namely Zenergy[j]. In other words, if the weighted sum of the error characteristic data elements of the new set of filter coefficients $H_2$ is less than or equal to the weighted sum of the error characteristic data elements of the old set of filter coefficients $H_1$, then an improvement in the error characteristic is detected and the improvement detection unit 606 releases a signal to the decision module 610 indicating that an improvement has been detected. Otherwise, the improvement detection unit 606 releases a signal to the decision module 610 indicating that no improvement has been detected.

Existence Detection Unit 612

The existence detection unit 612 determines whether a selected set of filter coefficients is indicative of a substantially null transfer function.

In a non-limiting example, the maximum amplitude of the frequency response described by a selected set of filter coefficients, say Selected_H, in each frequency bands is compared to a reference value, where the reference value is indicative of an almost null transfer function. In a non-limiting example, the maximum value of the amplitude of s Selected_H in a given frequency band j is Selected_H[j] added to Selected_Herror[j]. Mathematically, this can be expressed as follows:

DISTANCE[j]=Magnitude(Selected_H[j])+Selected_Herror[j] for
$\quad j=0 \ldots K-1$ $\quad$ Equation 46 where Magnitude(x) is a magnitude computation for a complex number, Selected_H[j] and Selected_Herror[j] are the components in frequency band j of Selected_H and Selected_Herror respectively, and DISTANCE is a set of K first distance measure data elements.

Following this, for each frequency band in the set of frequency bands, the ratio of the maximum amplitudes of Selected_H over the reference signal is calculated. Mathematically, this can be expressed as follows:

$$RATIO[j] = \frac{DISTANCE[j]}{REFERENCE[j]} \quad \text{Equation 47}$$

for $j = 0 \ldots K-1$ where REFERENCE[j] is the amplitude of the reference impulse response in frequency band j. The "almost null" transfer function depends on the application in which the filter adaptation unit 100 is used. In a non-limiting example, the adaptive system 170 is used in an echo canceling system and the almost null transfer function is a response having a gain of about −35 dB or less. For the set of K ratio, statistical methods can be used to determine where the ratios are located. In a first non-limiting implementation, the set of ratios is attributed to a Gaussian distribution and well-known statistical tests are performed to determine whether the distribution of the ratios is low enough that it cannot be explained by normal statistical variations. Various well-known statistical methods may be used here without detracting from the spirit of the invention and as such will not be described further. If the statistical tests indicate that the distribution of the ratios is low enough that it cannot be explained by normal statistical variations, then the existence detection unit 612 releases a signal to the decision module 610 indicating that a substantially null transfer function has been detected. Otherwise, the existence detection unit 612 releases a signal to the decision module 610 indicating that no substantially null transfer function has been detected.

Decision Module 610

Figure 7A:
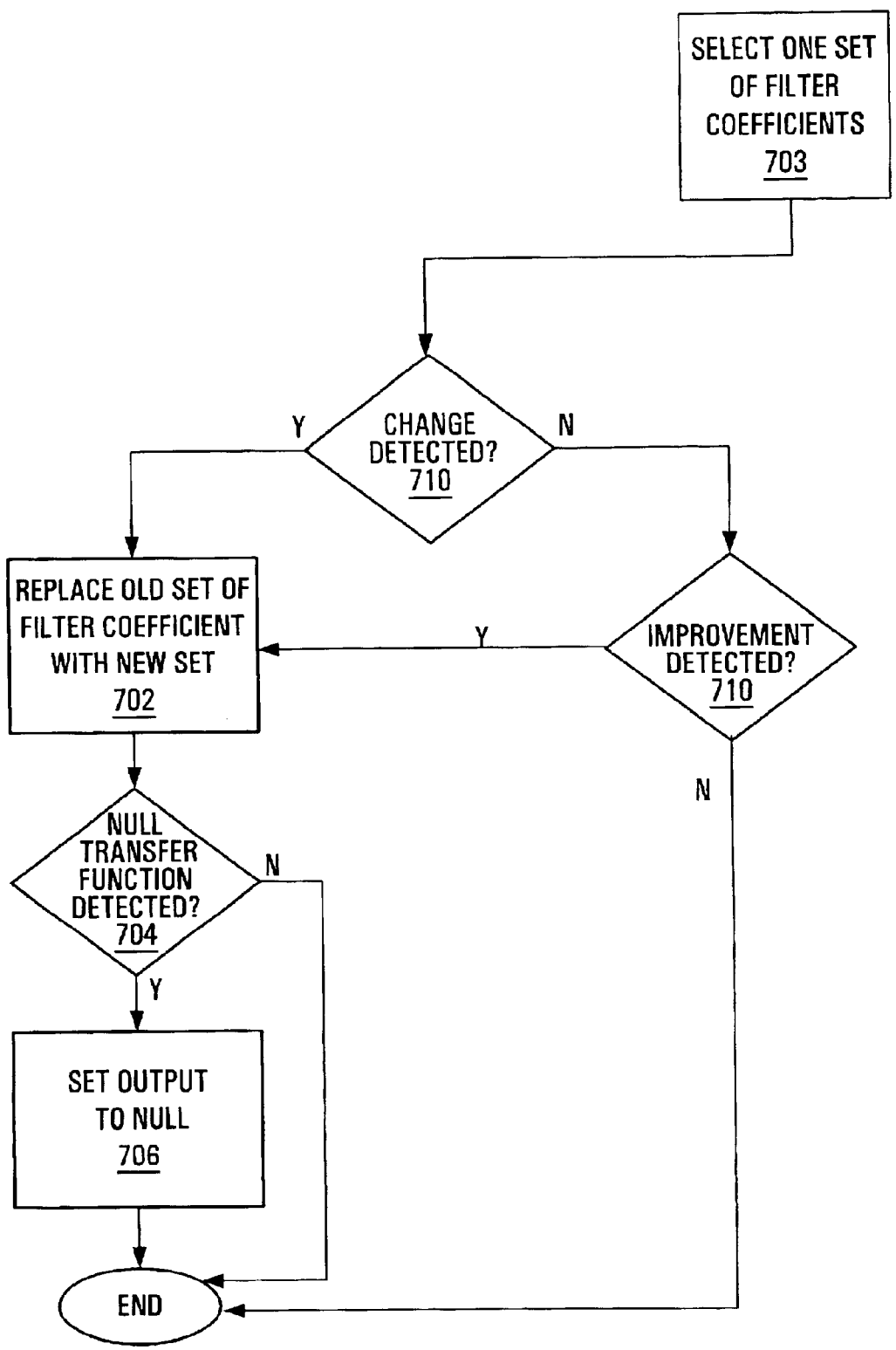
FIG. 7a is a flow diagram of a process implemented by the coefficient set selection unit 204 in accordance with an example of implementation of the invention.

The decision module 610 receives the results from the detection of a change unit 604 and the improvement detection unit 606 and makes use of these results to selects a set of filter coefficients. The functioning of the filter adaptation unit 202 will be described with regard to the flow diagram of FIG. 7a.

For the purpose of simplicity, a first example of implementation will first be described where Hbest includes one set of filter coefficients and Hnew 206 includes either one of a single set of filter coefficients or a plurality of sets of filter coefficients. The manner in which this detection of a change unit 604 may be extended to the case where Hnew 206 and Hbest include a plurality of sets of filter coefficients will be described later on in the specification.

In the case where Hnew 206 includes a plurality of sets of filter coefficients, decision module 610 starts at step 703 where one set of filter coefficients is selected from the plurality of sets of Hnew[i],for i=0 . . . FC-1. The decision module 610 selects a set of filter coefficients from the plurality of sets of Hnew[i] at least in part on the basis of energy values associated to respective sets of filter coefficients. The set of filter coefficients that provides the strongest impulse response is selected. In a non-limiting example, the energy values associated to respective sets of filter coefficients are conditioned at least on part on the basis of energy values associated to signal Z 102. Mathematically, a specific non-limiting implementation can be expressed as follows:

$$Selected\_Hnew = \underset{i=0}{\overset{FC-1}{MAX}}\left[\sum_{j=0}^{K-1}(Hnew[i][j])^2 * Zenergy[j]\right] \quad \text{Equation 48}$$

where Hnew[i][j] is the component of Hnew 206 in the ith segment for the jth frequency band. Alternatively, the associated sets of error characterization data elements Herror[i], i=0 . . . FC-1, may be used to condition the results of equation 48. Mathematically, a specific non-limiting implementation can be expressed as follows:

$$Selected\_Hnew = \quad \text{Equation 49}$$

$$\underset{i=0}{\overset{FC-1}{MAX}}\left[\sum_{j=0}^{K-1}(Hnew[i][j] - \beta Herror[i][j])^2 * Zenergy[j]\right]$$

where Herror[i][j] is the component of Herror in the ith segment for the jth frequency band and β is a scale factor ≦1. This step 703 will result in one selected set of filter coefficients, namely Selected_Hnew, along with its associated error characterization data element, Selected_Herror, and ordering data element, Selected_Hnew_age. In the equation above, when Hnew[i][j]−βHerror[i][j] is less than 0, the subtraction is set to 0. For step 703, the decision module proceeds to step 701.

In the case where Hnew 206 includes one set of filter coefficients, Selected_New=Hnew and the decision module 610 proceeds at step 700. At step 700, the decision module 610 queries the detection of a change unit 604 to determine whether a change between Selected_New and Hbest can be detected. If the signal returned by the detection of a change unit 604 indicates that a change has been detected, the decision module proceeds to step 702 and replaces the old set of filter coefficients Hbest, Hbest_error and Hbest_age in memory unit 240 by the new set of filter coefficients Selected$_{13}$ New 206, Selected_Herror and Selected_age. Following this, at step 704, the decision module 610 queries the existence detection unit 612 to determine whether a substantially null transfer function has been detected. If the signal returned by the existence detection unit 612 indicates that a substantially null transfer function has been detected, the decision module 610 proceeds to step 706 where a "0" transfer function is stored in memory unit 240. If at step 700 the signal returned by the detection of a change unit 604 indicates that no change has been detected, the decision module proceeds to step 710, where the decision module 610 queries the improvement detection unit 606 to determine whether an improvement between Hbest and Selected_H is present. If the signal returned by the improvement detection unit 606 indicates that an improvement has been detected, the decision module 610 proceeds to step 702 and replaces the old set of filter coefficients Hbest, Hbest_error and Hbest_age in memory unit 240 by the new set of filter coefficients Selected_New 206, Selected_Herror and Selected_Hnew_age. Following this, at step 704, the decision module 610 queries the existence detection unit 612 to determine whether the current Hbest is indicative of a substantially null transfer function. The decision module 610 considers the signal received from the existence detection unit 612. If the signal indicates that a substantially null transfer function has been detected, the decision module 610 proceeds to step 706 where a "0" transfer function is stored in memory unit 240. If at step 710, the signal indicates that a "0" transfer function has not been detected, no change made to the transfer function is stored in memory unit 240.

The set of filter coefficients in the active coefficient set memory unit 240 is released in a format suitable for use by filter 110.

Figure 7B:
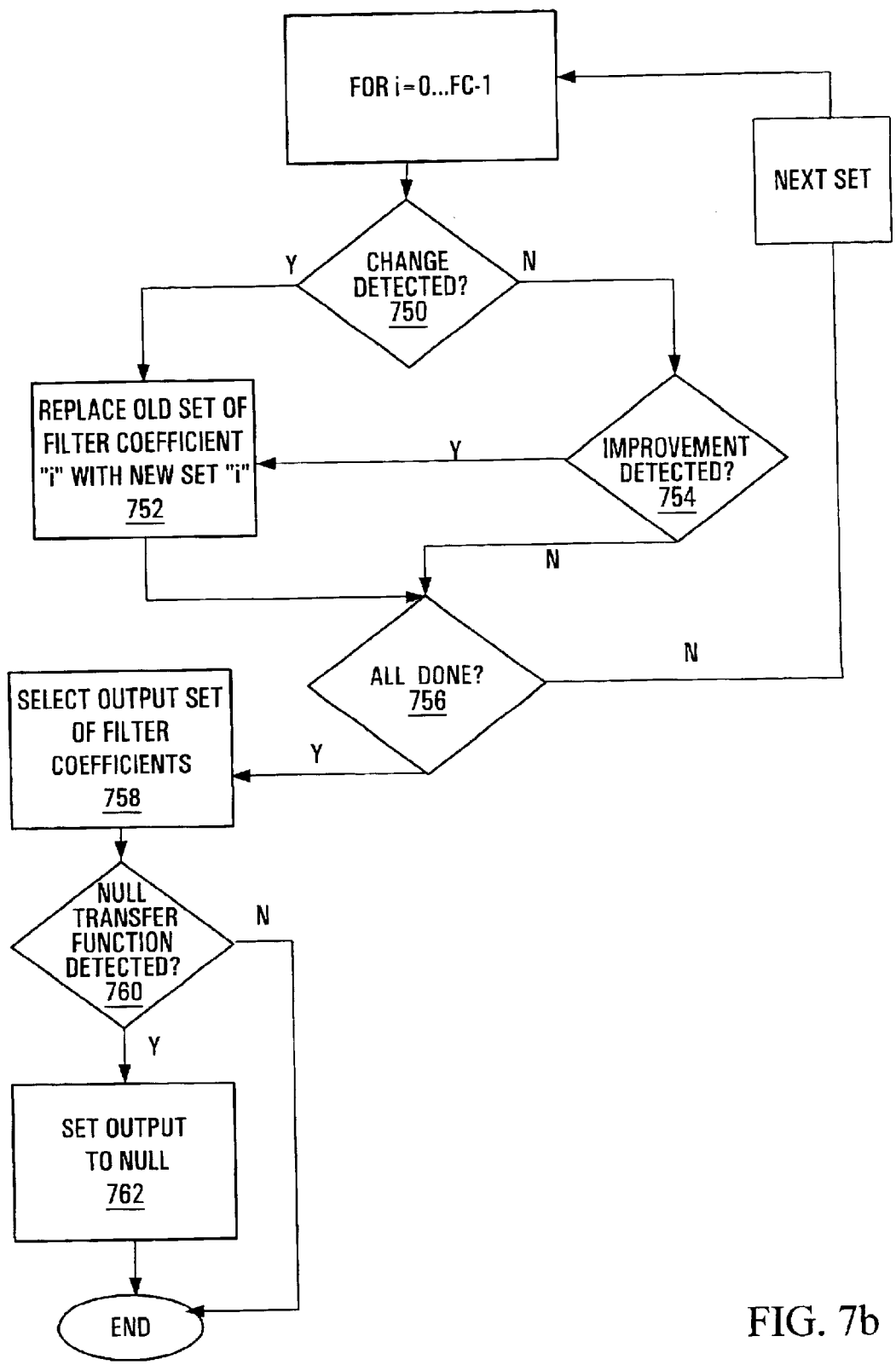
FIG. 7b is a flow diagram of a process implemented by the coefficient set selection unit 204 in accordance with an alternative example of implementation of the invention.

In the alternative non-limiting example where Hnew 206 and Hbest both comprise a plurality of sets of filter coefficients, Hnew[i] and Hbest[i], for i=0 . . . FC-1, the above described process is effected for each set of filter coefficients in Hnew 206. Referring to FIG. 7b for each set of filter coefficients in Hnew 206, the following steps are performed:

At step 750, the decision module 610 queries the detection of a change unit 604 to determine whether a change between Hnew[i] and Hbest[i] can be detected. If the signal returned by the decision module 610 indicates that a change has been detected, the decision module proceeds to step 752 and replaces the old set of filter coefficients Hbest[i], Hbest_error[i] and Hbest_age[i] in memory unit 240 by the new set of filter coefficients Hnew[i], Herror[i] and Hnew_age[i]. If at step 750, the signal returned by the decision module 610 indicates that no change has been detected, the decision module proceeds to step 754. At step 754, the decision module queries the improvement detection unit 606 to determine whether an improvement between Hbest[i] and Hnew[i] is present. If the signal returned by the improvement detection unit 606 indicates that an improvement has been detected, the decision module 610 proceeds to step 752 and replaces the old set of filter coefficients Hbest[i], Hbest_error[i] and Hbest_age[i] in memory unit 240 by the new set of filter coefficients Hnew[i], Herror[i] and Hnew_age[i]. Following step 752, or if the test at the signal returned by the improvement detection unit 606 indicated that no improvement was detected, the decision module 610 determines whether all the sets of filter coefficients Hnew[i], for i=0 . . . FC-1 have been processed. If any set of filter coefficients Hnew[i] remains to be processed, condition 756 is answered in the negative and the decision module 610 returns to step 750. Once all the sets of filter coefficients have been processed, the memory unit 240 will comprise updated sets of Hbest[i], Hbest_error[i] and Hbest_age[i], for i=0 . . . FC-1.

Once all the sets of filter coefficients have been processed, condition 756 is answered in the affirmative and the decision module 610 proceeds to step 758 where one set of filter coefficients is selected from the plurality of sets of Hbest [i], for i=0 . . . FC-1 in memory unit 240. The decision module 610 selects a set of filter coefficients from the plurality of sets of Hbest[i] at least in part on the basis of energy values associated to respective sets of filter coefficients. The set of filter coefficients, which provides the strongest impulse response, is selected. In a non-limiting example, the energy values associated to respective sets of filter coefficients are conditioned, at least in part, on the basis of energy values associated to signal Z 102. Mathematically, a specific non-limiting implementation can be expressed as follows:

$$\text{Selected\_H} = \underset{i=0}{\overset{FC-1}{\text{MAX}}}\left[\sum_{j=0}^{K-1}(Hbest[i][j])^2 * Zenergy[j]\right] \quad \text{Equation 50}$$

where Hbest[i][j] is the component of Hbest in the jth segment for the jth frequency band. Alternatively, the associated sets of error characterization data elements Hbest_error[i], i=0 . . . FC-1, may be used to condition the results of equation 50. Mathematically, a specific non-limiting implementation can be expressed as follows:

$$\text{Selected\_H} = \underset{i=0}{\overset{FC-1}{\text{MAX}}}\left[\sum_{j=0}^{K-1}(Hbest[i][j] - \text{Hbest\_error}[i][j])^2 * Zenergy[j]\right] \quad \text{Equation 51}$$

where Hbest error[i][j] is the component of Hbest_error in the ith segment for the jth frequency band and β is a scale factor≦1. This step 758 will result in one selected set of filter coefficients, namely Selected_H, along with its associated error characterization data element, Selected_Herror, and ordering data element, Selected_Hnew_age. In the equation above, when Hbest[i][j]−βHbest_error[i][j] is less than 0, the subtraction is set to 0.

Following this, at step 760, the decision module 610 considers queries from the existence detection unit 612 to determine whether Selected_H has a substantially null transfer function. The decision module 610 considers the signal returned by the existence detection unit 612 in response to the query. If the signal indicates that a substantially null transfer function has been detected, the decision module 610 proceeds to step 762 where a "0" transfer function is stored in memory unit 240. If at step 762, the signal indicates that a no substantially null transfer function has been detected, no change is made to the transfer function stored in memory unit 240.

The set of filter coefficients in the active coefficient set memory unit 240 is released as H 116 in a format suitable for use by filter 110.

Figure 8:
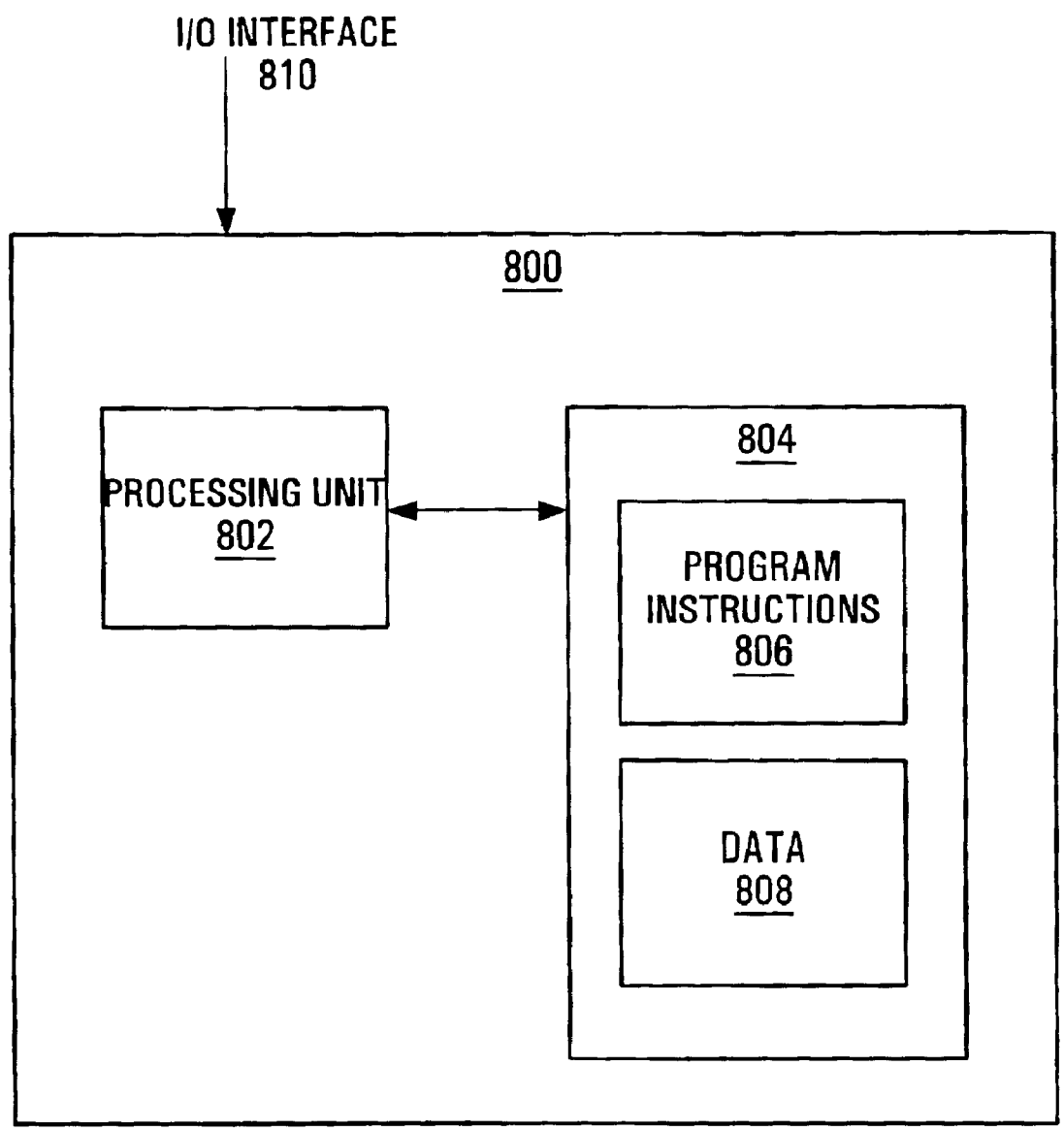
FIG. 8 is a block diagram of an apparatus for generating a set of filter coefficients in accordance with a specific example of implementation of the invention.

The above-described process for producing a set of filter coefficients can be implemented on a general purpose digital computer, of the type depicted in FIG. 8, including a processing unit 802 and a memory 804 connected by a communication bus. The memory includes data 808 and program instructions 806. The processing unit 802 is adapted to process the data 808 and the program instructions 806 in order to implement the functional blocks described in the specification and depicted in the drawings. The digital computer 800 may also comprise an I/O interface 810 for receiving or sending data elements to external devices. For example, the I/O interface may be used for receiving the first signal Z 102 and the second signal X 104.

Alternatively, the above-described process for producing a set of filter coefficients can be implemented on a dedicated hardware platform where electrical/optical components implement the functional blocks described in the specification and depicted in the drawings. Specific implementations may be realized using ICs, ASICs, DSPs, FPGA, or other suitable hardware platform. It will be readily appreciated that the hardware platform is not a limiting component of the invention.

Although the present invention has been described in considerable detail with reference to certain preferred embodiments thereof, variations and refinements are possible without departing from the spirit of the invention. Therefore, the scope of the invention should be limited only by the appended claims and their equivalents.

What is claimed is:

1. A filter adaptation unit suitable for producing a set of filter coefficients indicative of a transfer function of a system in a given state, said filter adaptation unit comprising:
   a) a first input for receiving a sequence of samples of a first signal;
   b) a second input for receiving a sequence of samples of a second signal, the second signal including a certain component which is correlated to the first signal;

c) a coefficient generation unit operatively coupled to said first input and said second input, said coefficient generation unit being operative for generating:
   i. a first set of filter coefficients on the basis of first subsets of the sequences of samples of the first signal and the second signal, the first set of filter coefficients being such that when the first set of filter coefficients is applied by an adaptive filter on the first signal, a first estimate of the certain component in the second signal is generated, the certain component being correlated to the first signal;
   ii. a second set of filter coefficients on the basis of second subsets of the sequences of samples of the first signal and the second signal, at least some samples in the second subsets being subsequent to the samples in corresponding first subsets, the second set of filter coefficients being such that when the first set of filter coefficients is applied by an adaptive filter on the first signal, a second estimate of the certain component in the second signal is generated, the certain component being correlated to the first signal;
d) an error characterization unit operative for:
   i. processing the first signal and the second signal on the basis of the first set of filter coefficients to generate a first set of error characterization data elements associated to the first set of filter coefficients;
   ii. processing the first signal and the second signal on the basis of the second set of filter coefficients to generate a second set of error characterization data elements associated to the second set of filter coefficients;
e) a selection unit operative for:
   i. detecting a change of state at least in part of the basis of:
      (a) the first and second sets of filter coefficients; and
      (b) the second set of error characterization data elements;
   ii. selecting the second set of filter coefficients when a change of state is detected in i.;
   iii. selecting either one of the first set of filter coefficients and the second set of filter coefficients, at least in part, on the basis of the first and second sets of error characterization data elements when no change of state is detected in i.;
f) an output for releasing a signal indicative of the set of filter coefficients selected by the selection unit.

2. A filter adaptation unit as defined in claim 1, wherein:
a) the first subset of the sequence of samples of the first signal includes a plurality of successive samples, said plurality of successive samples including a beginning sample;
b) the second subset of the sequence of samples of the first signal includes a plurality of successive samples, said plurality of successive samples including a beginning sample;
c) said selection unit operative for precluding detection of a change of state when the beginning sample of the first subset of the sequence of samples of the first signal is received by the first input of the filter adaptation unit subsequent to the beginning sample of second subset of the sequence of samples of the first signal.

3. A filter adaptation unit as defined in claim 2, wherein said selection unit is operative for:
a) comparing the first set of filter coefficients and the second set of filter coefficients to derive a first distance measure data element;
b) comparing the first set of error characterization data elements and the second set of error characterization data elements to derive a second distance measure data element;
c) detecting a change of state at least in part of the basis of the first distance measure data element and the second distance measure data element.

4. A filter adaptation unit as defined in claim 3, wherein each error characterization data element in the first and second sets of error characterization data elements is associated to a respective frequency band selected from a set of frequency bands, said selection unit being operative for:
a) processing the first set of filter coefficients to derive a first set of spectral values, each spectral value in said first set corresponding to a respective frequency band selected from a set of frequency bands;
b) processing the second set of filter coefficients to derive a second set of spectral values, each spectral value in said second set corresponding to a respective frequency band selected from a set of frequency bands;
c) comparing the first set of spectral values to the second set of spectral values to derive a set of first distance measure data elements, each of said first distance measure data elements being associated to a respective frequency band from the set of frequency bands;
d) comparing the first set of error characterization data elements and the second set of error characterization data elements to derive a set of second distance measure data element, each of said second distance measure data elements being associated to a respective frequency band from the set of frequency bands;
e) detecting a change of state at least in part on the basis of the set of first distance measure data elements and the set of second distance measure data elements.

5. A filter adaptation unit as defined in claim 1, wherein each error characterization data element in the first and second sets of error characterization data elements is associated to a respective frequency band selected from a set of frequency bands.

6. A filter adaptation unit as defined in claim 5, wherein each error characterization data element in the first and second sets of error characterization data elements includes a standard deviation data element associated to a respective frequency band in the set of frequency bands.

7. A filter adaptation unit as defined in claim 6, wherein said selection unit is operative for:
a) computing a first energy data element at least in part on the basis of the first set of error characterization data elements, the first energy data element being indicative of an error size associated to the first set of filter coefficients;
b) computing a second energy data element at least in part on the basis of the second set of error characterization data elements, the second energy data element being indicative of an error size associated to the second set of filter coefficients;
c) selecting the set of filter coefficients on the basis of the first energy data element and the second energy data element when no change of state is detected.

8. A filter adaptation unit as defined in claim 1, wherein said selection unit is operative for processing the selected set of filter coefficients at least in part on the basis of a reference set of data elements prior to release at the output to determine whether the selected set of filter coefficients is indicative of a substantially null transfer function.

9. A filter adaptation unit as defined in claim 8, wherein when the selected set of filter coefficients is indicative of a substantially null transfer function, said selection unit being operative for replacing the selected set of filter coefficients by a null set of filter coefficients prior to releasing the selected set of filter coefficients at the output.

10. A method suitable for producing a set of filter coefficients indicative of a transfer function of a system in a given state, said method comprising:
 a) receiving a sequence of samples of a first signal;
 b) receiving a sequence of samples of a second signal, the second signal including a certain component which is correlated to the first signal;
 c) generating a first set of filter coefficients on the basis of first subsets of the sequences of samples of the first signal and the second signal, the first set of filter coefficients being such that when the first set of filter coefficients is applied by an adaptive filter on the first signal, a first estimate of the certain component in the second signal is generated, the certain component being correlated to the first signal;
 d) generating a second set of filter coefficients on the basis of second subsets of the sequences of samples of the first signal and the second signal, at least some samples in the second subsets being subsequent to the samples in corresponding first subsets, the second set of filter coefficients being such that when the second set of filter coefficients is applied by an adaptive filter on the first signal, a second estimate of the certain component in the second signal is generated, the certain component being correlated to the first signal;
 e) processing the first signal and the second signal on the basis of the first set of filter coefficients to generate a first set of error characterization data elements associated to the first set of filter coefficients;
 f) processing the first signal and the second signal on the basis of the second set of filter coefficients to generate a second set of error characterization data elements associated to the second set of filter coefficients;
 g) detecting a change of state at least in part of the basis of:
  i. the first and second sets of filter coefficients; and
  ii. the second set of error characterization data elements;
 h) selecting the second set of filter coefficients when a change of state is detected in g);
 i) selecting either one of the first set of filter coefficients and the second set of filter coefficients at least in part on the basis of the first and second sets of error characterization data elements when no change of state is detected in g);
 j) releasing a signal indicative of the selected set of filter coefficients.

11. A method as defined in claim 10, wherein:
 a) the first subset of the sequence of samples of the first signal includes a plurality of successive samples, said plurality of successive samples including a beginning sample;
 b) the second subset of the sequence of samples of the first signal includes a plurality of successive samples, said plurality of successive samples including a beginning sample;
said method further comprising precluding detection of a change of state when the beginning sample of the first subset of the sequence of samples of the first signal is received subsequently to the beginning sample of the second subset of the sequence of samples of the first signal.

12. A method as defined in claim 11, wherein said method further comprises:
 a) comparing the first set of filter coefficients and the second set of filter coefficients to derive a first distance measure data element;
 b) comparing the first set of error characterization data elements and the second set of error characterization data elements to derive a second distance measure data element;
 c) detecting a change of state at least in part on the basis of the first distance measure data element and the second distance measure data element.

13. A method as defined in claim 12, wherein each error characterization data element in the first and second sets of error characterization data elements is associated to a respective frequency band selected from a set of frequency bands, said method further comprising:
 a) processing the first set of filter coefficients to derive a first set of spectral values, each spectral value in said first set corresponding to a respective frequency band selected from a set of frequency bands;
 b) processing the second set of filter coefficients to derive a second set of spectral values, each spectral value in said second set corresponding to a respective frequency band selected from a set of frequency bands;
 c) comparing the first set of spectral values to the second set of spectral values to derive a set of first distance measure data elements, each of said first distance measure data elements being associated to a respective frequency band from the set of frequency bands;
 d) comparing the first set of error characterization data elements and the second set of error characterization data elements to derive a set of second distance measure data element, each of said second distance measure data elements being associated to a respective frequency band from the set of frequency bands;
 e) detecting a change of state, at least in part, on the basis of the set of first distance measure data elements and the set of second distance measure data elements.

14. A method as defined in claim 10, wherein each error characterization data element in the first set of error characterization data elements and in the second set of error characterization data elements is associated to a respective frequency band selected from a set of frequency bands.

15. A method as defined in claim 14, wherein each error characterization data element in the first and second sets of error characterization data elements includes a standard deviation data element associated to a respective frequency band in the set of frequency bands.

16. A method as defined in claim 15, wherein said method comprises:
 a) computing a first energy data element at least in part on the basis of the first set of error characterization data elements, the first energy data element being indicative of an error size associated to the first set of filter coefficients;
 b) computing a second energy data element at least in part on the basis of the second set of error characterization data elements, the second energy data element being indicative of an error size associated to the second set of filter coefficients;
 c) selecting the set of filter coefficients on the basis of the first energy data element and the second energy data element when no change of state is detected.

17. A method as defined in claim 10, wherein said method comprises processing the selected set of filter coefficients at least in part on the basis of a reference set of data elements prior to releasing the selected set of filter coefficients to determine whether the selected set of filter coefficients is indicative of a substantially null transfer function.

18. A method as defined in claim 17, wherein when the selected set of filter coefficients is indicative of a substantially null transfer function, said method comprises:
 a) replacing the selected set of filter coefficients by a null set of filter coefficients;
 b) releasing the null set of filter coefficients.

19. A computer readable medium including a program element suitable for execution by a computing apparatus for producing a set of filter coefficients, the set of filter coefficients being suitable for use by an adaptive filter and being indicative of a transfer function of a system in a given state, said computing apparatus comprising:
 a) a memory unit;
 b) a processor operatively connected to said memory unit, said program element when executing on said processor being operative for:
  i. receiving a sequence of samples of a first signal;
  ii. receiving a sequence of samples of a second signal, the second signal including a certain component which is correlated to the first signal;
  iii. generating a first set of filter coefficients on the basis of first subsets of the sequences of samples of the first signal and the second signal, the first set of filter coefficients being such that when the first set of filter coefficients is applied by an adaptive filter on the first signal, a first estimate of the certain component in the second signal is generated, the certain component being correlated to the first signal;
  iv. generating a second set of filter coefficients on the basis of second subsets of the sequences of samples of the first signal and the second signal, at least some samples in the second subsets being subsequent to the samples in corresponding first subsets, the second set of filter coefficients being such that when the second set of filter coefficients is applied by an adaptive filter on the first signal, a second estimate of the certain component in the second signal is generated, the certain component being correlated to the first signal;
  v. processing the first signal and the second signal on the basis of the first set of filter coefficients to generate a first set of error characterization data elements associated to the first set of filter coefficients;
  vi. processing the first signal and the second signal on the basis of the second set of filter coefficients to generate a second set of error characterization data elements associated to the second set of filter coefficients;
  vii. detecting a change of state at least in part of the basis of:
   (a) the first and second sets of filter coefficients; and
   (b) the second set of error characterization data elements;
  viii. selecting the second set of filter coefficients when a change of state is detected in vii.;
  ix. selecting either one of the first set of filter coefficients and the second set of filter coefficients at least in part on the basis of the first and second sets of error characterization data elements when no change of state is detected in vii.;
  x. releasing a signal indicative of the selected set of filter coefficients.

20. A computer readable medium as defined in claim 19, wherein:
 a) the first subset of the sequence of samples of the first signal includes a plurality of successive samples, said plurality of successive samples including a beginning sample;
 b) the second subset of the sequence of samples of the first signal includes a plurality of successive samples, said plurality of successive samples including a beginning sample;
said program element when executing on said processor being further operative for precluding detection of a change of state when the beginning sample of the first subset of the sequence of samples of the first signal is received subsequently to the beginning sample of the second subset of the sequence of samples of the first signal.

21. A computer readable medium as defined in claim 20, wherein said program element when executing on said processor is further operative for:
 a) comparing the first set of filter coefficients and the second set of filter coefficients to derive a first distance measure data element;
 b) comparing the first set of error characterization data elements and the second set of error characterization data elements to derive a second distance measure data element;
 c) detecting a change of state, at least in part, on the basis of the first distance measure data element and the second distance measure data element.

22. A computer readable medium as defined in claim 21, wherein each error characterization data element in the first and second sets of error characterization data elements is associated to a respective frequency band selected from a set of frequency bands, said program element when executing on said processor being further operative for:
 a) processing the first set of filter coefficients to derive a first set of spectral values, each spectral value in said first set corresponding to a respective frequency band selected from a set of frequency bands;
 b) processing the second set of filter coefficients to derive a second set of spectral values, each spectral value in said second set corresponding to a respective frequency band selected from a set of frequency bands;
 c) comparing the first set of spectral values to the second set of spectral values to derive a set of first distance measure data elements, each of said first distance measure data elements being associated to a respective frequency band from the set of frequency bands;
 d) comparing the first set of error characterization data elements and the second set of error characterization data elements to derive a set of second distance measure data element, each of said second distance measure data elements being associated to a respective frequency band from the set of frequency bands;
 e) detecting a change of state, at least in part, on the basis of the set of first distance measure data elements and the set of second distance measure data elements.

23. A computer readable medium as defined in claim 19, wherein each error characterization data element in the first set of error characterization data elements and in the second set of error characterization data elements is associated to a respective frequency band selected from a set of frequency bands.

24. A computer readable medium as defined in claim 23, wherein each error characterization data element in the first and second sets of error characterization data elements includes a standard deviation data element associated to a respective frequency band in the set of frequency bands.

25. A computer readable medium as defined in claim 24, wherein said program element when executing on said processor is further operative for:
   a) computing a first energy data element at least in part on the basis of the first set of error characterization data elements, the first energy data element being indicative of an error size associated to the first set of filter coefficients;
   b) computing a second energy data element at least in part on the basis of the second set of error characterization data elements, the second energy data element being indicative of an error size associated to the second set of filter coefficients;
   c) selecting the set of filter coefficients on the basis of the first energy data element and the second energy data element when no change of state is detected.

26. A computer readable medium as defined in claim 19, wherein said program element when executing on said processor is further operative for processing the selected set of filter coefficients at least in part on the basis of a reference set of data elements prior to releasing the selected set of filter coefficients to determine whether the selected set of filter coefficients is indicative of a substantially null transfer function.

27. A computer readable medium as defined in claim 26, wherein when the selected set of filter coefficients is indicative of a substantially null transfer function, said program element when executing on said processor being further operative for:
   a) replacing the selected set of filter coefficients by a null set of filter coefficients;
   b) releasing the null set of filter coefficients.

28. An adaptive system comprising:
   a) a first input for receiving a sequence of samples from a first signal;
   b) a second input for receiving a sequence of samples of a second signal, the second signal including a certain component which is correlated to the first signal;
   c) a filter adaptation unit operatively coupled to said first and second inputs, said filter adaptation unit comprising:
      i. a coefficient generation unit operative for generating:
         (a) a first set of filter coefficients on the basis of first subsets of the sequences of samples of the first signal and the second signal, the first set of filter coefficients being such that when the first set of filter coefficients is applied by an adaptive filter on the first signal, a first estimate of the certain component in the second signal is generated, the certain component being correlated to the first signal;
         (b) a second set of filter coefficients on the basis of second subsets of the sequences of samples of the first signal and the second signal, at least some samples in the second subsets being subsequent to the samples in corresponding first subsets, the second set of filter coefficients being such that when the second set of filter coefficients is applied by an adaptive filter on the first signal, a second estimate of the certain component in the second signal is generated, the certain component being correlated to the first signal;
      ii. an error characterization unit operative for:
         (a) processing the first signal and the second signal on the basis of the first set of filter coefficients to generate a first set of error characterization data elements associated to the first set of filter coefficients;
         (b) processing the first signal and the second signal on the basis of the second set of filter coefficients to generate a second set of error characterization data elements associated to the second set of filter coefficients;
      iii. a selection unit operative for:
         (a) detecting a change of state, at least in part, on the basis of:
            (i) the first and second sets of filter coefficients; and
            (ii) the second set of error characterization data elements;
         (b) selecting the second set of filter coefficients when a change of state is detected in (a);
         (c) selecting either one of the first set of filter coefficients and the second set of filter coefficients at least in part on the basis of the first and second sets of error characterization data elements when no change of state is detected in (a);
      iv. an output for releasing a signal indicative of the set of filter coefficients selected by the selection unit;
   d) an adaptive filter operatively coupled to said first input and to the output of said filter adaptation unit, said adaptive filter being operative to apply a filtering operation to the first signal on the basis of the set of filter coefficients received from said filter adaptation unit to generate an estimate of the component in the second signal, the component being correlated to the first signal.

29. An echo canceller comprising the adaptive system of claim 28.

30. A filter adaptation unit suitable for producing a set of filter coefficients, said filter adaptation unit comprising:
   a) means for receiving a sequence of samples of a first signal;
   b) means for receiving a sequence of samples of a second signal, the second signal including a certain component which is correlated to the first signal;
   c) means for generating a first set of filter coefficients on the basis of first subsets of the sequences of samples of the first signal and the second signal, the first set of filter coefficients being such that when the first set of filter coefficients is applied by an adaptive filter on the first signal, a first estimate of the certain component in the second signal is generated, the certain component being correlated to the first signal;
   d) means for generating a second set of filter coefficients on the basis of second subsets of the sequences of samples of the first signal and the second signal, at least some samples in the second subsets being subsequent to the samples in corresponding first subsets, the second set of filter coefficients being such that when the second set of filter coefficients is applied by an adaptive filter on the first signal, a second estimate of the certain component in the second signal is generated, the certain component being correlated to the first signal;
   e) means for processing the first signal and the second signal on the basis of the first set of filter coefficients to generate a first set of error characterization data elements associated to the first set of filter coefficients;

f) means for processing the first signal and the second signal on the basis of the second set of filter coefficients to generate a second set of error characterization data elements associated to the second set of filter coefficients;

g) means for detecting a change of state at least in part of the basis of:
  i. the first and second sets of filter coefficients; and
  ii. the second set of error characterization data elements;

h) means for selecting operative for:
  i. selecting the second set of filter coefficients when a change of state is detected in g);
  ii. selecting either one of the first set of filter coefficients and the second set of filter coefficients at least in part on the basis of the first and second sets of error characterization data elements when no change of state is detected in g);

i) means for releasing a signal indicative of the selected set of filter coefficients.

31. A filter adaptation unit suitable for producing a set of filter coefficients, said filter adaptation unit comprising:
  a) a first input for receiving a sequence of samples of a first signal;
  b) a second input for receiving a sequence of samples of a second signal, the second signal including a certain component which is correlated to the first signal;
  c) a processing unit operative for generating a plurality of sets of filter coefficients on the basis of the sequences of samples of the first signal and the second signal, each set of filter coefficients in said plurality of sets of filter coefficients being associated to a respective segment of said second signal, each segment of said second signal comprising a subset of samples of the sequence of samples of the second signal;
  d) a selection unit operative for comparing the sets of filter coefficients to one another to select at least one set of filter coefficients from said plurality of sets of filter coefficients;
  e) an output for releasing a signal indicative of the set of filter coefficients selected by the selection unit.

32. A filter adaptation unit as described in claim 31, wherein each set of filter coefficients is associated to a respective impulse response, said selection unit being operative for selecting the at least one set of filter coefficients at least in part on the basis of energy values of the impulse responses associated to the plurality of sets of filter coefficients.

33. A filter adaptation unit as described in claim 32, said filter adaptation unit further comprising an error characterization unit operative for processing the first signal and the second signal on the basis of the plurality of sets of filter coefficients to generate a plurality of sets of error characterization data elements, each set of error characterization data elements being associated to a respective set of filter coefficients from said plurality of sets of filter coefficients, said selection unit operative for conditioning the energy values of the impulse responses associated to the plurality of sets of filter coefficients at least on part on the basis of said plurality of sets of error characterization data elements.

34. A filter adaptation unit as described in claim 32, wherein said selection unit is operative for conditioning the energy values of the impulse responses associated to the plurality of sets of filter coefficients at least in part on the basis of energy values associated to said first signal.

35. A method for producing a set of filter coefficients, said method comprising:
  a) receiving a sequence of samples of a first signal;
  b) receiving a sequence of samples of a second signal, the second signal including a certain component which is correlated to the first signal;
  c) generating a plurality of sets of filter coefficients on the basis of the sequences of samples of the first signal and the second signal, each set of filter coefficients in said plurality of sets of filter coefficients being associated to a respective segment of said second signal, each segment of said second signal comprising a subset of samples of the sequence of samples of the second signal;
  d) comparing the sets of filter coefficients to one another to select at least one set of filter coefficients from said plurality of sets of filter coefficients;
  e) releasing a signal indicative of the set of filter coefficients selected by the selection unit.

36. A method as described in claim 35, wherein each set of filter coefficients is associated to a respective impulse response, said method comprising selecting the at least one set of filter coefficients at least in part on the basis of energy values of the impulse responses associated to the plurality of sets of filter coefficients.

37. A method as described in claim 36, wherein said method further comprises:
  a) processing the first signal and the second signal on the basis of the plurality of sets of filter coefficients to generate a plurality of sets of error characterization data elements, each set of error characterization data elements being associated to a respective set of filter coefficients from said plurality of sets of filter coefficients;
  b) conditioning the energy values of the impulse responses associated to the plurality of sets of filter coefficients, at least in part, on the basis of said plurality of sets of error characterization data elements.

38. A method as described in claim 37, wherein said method further comprises conditioning the energy values of the impulse responses associated to the plurality of sets of filter coefficients, at least in part, on the basis of energy values associated to said first signal.

* * * * *